US012615931B2

(12) United States Patent
Jang

(10) Patent No.: US 12,615,931 B2
(45) Date of Patent: Apr. 28, 2026

(54) ANISOTROPIC CONDUCTIVE FILM AND DISPLAY DEVICE INCLUDING SAME

(71) Applicant: Samsung Display Co., LTD., Yongin-si (KR)

(72) Inventor: Joo Nyung Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 494 days.

(21) Appl. No.: 18/104,471

(22) Filed: Feb. 1, 2023

(65) Prior Publication Data

US 2023/0290751 A1     Sep. 14, 2023

(30) Foreign Application Priority Data

Mar. 14, 2022     (KR) ......................... 10-2022-0031678

(51) Int. Cl.
H01L 23/00        (2006.01)
H10K 59/131      (2023.01)

(52) U.S. Cl.
CPC .............. H01L 24/29 (2013.01); H01L 24/05 (2013.01); H01L 24/27 (2013.01); H01L 24/32 (2013.01);
(Continued)

(58) Field of Classification Search
CPC ......... H01L 24/27; H01L 24/05; H01L 24/17; H01L 24/29; H01L 24/83; H01L 24/32; H01L 24/81; H01L 24/75; H01L 24/26; H01L 24/16; H01L 25/18; H01L 23/481; H01L 23/49816; H01L 24/13;
(Continued)

(56) References Cited

U.S. PATENT DOCUMENTS 5,001,302  A  *   3/1991  Atsumi ..................... H01R 4/04
                                                              439/91
5,120,665  A  *   6/1992  Tsukagoshi ............. H01L 24/05
                                                              257/E21.511
(Continued)

FOREIGN PATENT DOCUMENTS

KR      10-2019-0065438       6/2019
KR      10-2021-0127811       10/2021
KR      10-2021-0146455       12/2021

*Primary Examiner* — Mouloucoulaye Inoussa
(74) *Attorney, Agent, or Firm* — Lerner David LLP

(57)                    ABSTRACT

The disclosure relates to a display device and an anisotropic conductive film. An anisotropic conductive film disposed between a display panel and a printed circuit board, the anisotropic conductive film including a base resin, a plurality of first conductive balls dispersed in the base resin, each of the plurality of first conductive balls including a core made of a polymer material and at least one metal layer surrounding the core, and a plurality of second conductive balls dispersed in the base resin, each of the plurality of second conductive balls being made of a meltable material, and the anisotropic conductive film having a first area in which the anisotropic conductive film overlaps the first pad electrode and the first lead electrode in a thickness direction of the display device, and a second area as an area disposed between the first lead electrode and the second lead electrode. Each of the metal layer of the first conductive ball and a surface of the second conductive ball are in contact with both the first pad electrode and the first lead electrode.

20 Claims, 29 Drawing Sheets

(52) U.S. Cl.
CPC ........... *H01L 24/83* (2013.01); *H10K 59/131*
(2023.02); *H01L 2224/05553* (2013.01); *H01L*
*2224/05558* (2013.01); *H01L 2224/2711*
(2013.01); *H01L 2224/2733* (2013.01); *H01L*
*2224/29006* (2013.01); *H01L 2224/29028*
(2013.01); *H01L 2224/2929* (2013.01); *H01L*
*2224/29309* (2013.01); *H01L 2224/29311*
(2013.01); *H01L 2224/29313* (2013.01); *H01L*
*2224/29316* (2013.01); *H01L 2224/29318*
(2013.01); *H01L 2224/29339* (2013.01); *H01L*
*2224/29344* (2013.01); *H01L 2224/29347*
(2013.01); *H01L 2224/2939* (2013.01); *H01L*
*2224/29444* (2013.01); *H01L 2224/29455*
(2013.01); *H01L 2224/29499* (2013.01); *H01L*
*2224/32227* (2013.01); *H01L 2224/32501*
(2013.01); *H01L 2224/83203* (2013.01); *H01L*
*2224/83851* (2013.01); *H01L 2224/83862*
(2013.01); *H01L 2224/83951* (2013.01); *H01L*
*2924/0615* (2013.01); *H01L 2924/0635*
(2013.01); *H01L 2924/0665* (2013.01); *H01L*
*2924/0685* (2013.01); *H01L 2924/069*
(2013.01)

(58) Field of Classification Search
CPC ......... H01L 24/06; H01L 24/14; H01L 24/11;
H01L 2924/069; H01L 2224/29316;
H01L 2224/29318; H01L 2924/0685;
H01L 2224/29444; H01L 2224/05553;
H01L 2224/29313; H01L 2224/32501;
H01L 2224/83862; H01L 2224/29339;
H01L 2224/83951; H01L 2224/83101;
H01L 2224/83851; H01L 2224/29083;
H01L 2224/81208; H01L 2224/81455;
H01L 2224/32145; H01L 2224/13155;
H01L 2224/81447; H01L 2224/8388;
H01L 2224/0239; H01L 2224/1403;
H01L 2224/16227; H01L 2224/94; H01L
2224/14136; H01L 2224/13561; H01L
2224/1145; H01L 2224/14177; H10K
59/131; H10K 59/12; H10H 20/857;
G02F 1/13452; G01R 1/07357; G01R
31/28; G01R 1/0735; G01R 1/073; G01R
1/07307; G01R 1/06; G01R 31/26; G01R
1/06733; G01R 1/06755; H05K 1/0393
See application file for complete search history.

(56) References Cited

U.S. PATENT DOCUMENTS

| | | | | |
|---|---|---|---|---|
| 5,155,301 A | * | 10/1992 | Mase | H05K 3/323 |
| | | | | 174/117 FF |
| 5,586,892 A | * | 12/1996 | Sato | H05K 3/323 |
| | | | | 439/91 |
| 10,804,233 B1 | * | 10/2020 | Khandekar | H01L 24/13 |
| 2004/0234763 A1 | * | 11/2004 | Saito | C09J 9/02 |
| | | | | 428/402.2 |
| 2007/0030433 A1 | * | 2/2007 | Kudo | H05K 3/323 |
| | | | | 349/149 |
| 2009/0239082 A1 | * | 9/2009 | Fujita | H05K 3/323 |
| | | | | 428/413 |
| 2010/0025097 A1 | * | 2/2010 | Kojima | C09J 9/02 |
| | | | | 174/261 |
| 2010/0080995 A1 | * | 4/2010 | Ishimatsu | H05K 3/323 |
| | | | | 156/60 |
| 2011/0088935 A1 | | 4/2011 | Ishimatsu et al. | |
| 2015/0008022 A1 | | 1/2015 | Masui et al. | |
| 2015/0246521 A1 | * | 9/2015 | Fathi | C09J 9/02 |
| | | | | 522/182 |
| 2017/0309646 A1 | * | 10/2017 | Son | G06F 1/1637 |
| 2017/0310020 A1 | * | 10/2017 | Hirayama | C23C 18/30 |
| 2017/0352834 A1 | * | 12/2017 | Kim | H10K 77/111 |
| 2018/0082971 A1 | * | 3/2018 | Lin | H01L 24/32 |
| 2018/0088388 A1 | * | 3/2018 | Furuta | G02F 1/13452 |
| 2018/0108643 A1 | * | 4/2018 | Kim | H01L 24/14 |
| 2018/0190876 A1 | * | 7/2018 | Liu | H10H 20/84 |
| 2018/0301432 A1 | * | 10/2018 | Shinohara | H01L 24/27 |
| 2018/0355126 A1 | * | 12/2018 | Campbell | C08K 9/10 |
| 2018/0371122 A1 | * | 12/2018 | Campbell | C09B 6/00 |
| 2019/0212365 A1 | * | 7/2019 | Sasadaira | G01R 1/07357 |
| 2020/0194906 A1 | * | 6/2020 | Im | H01R 43/00 |
| 2020/0403054 A1 | * | 12/2020 | Jang | H01L 24/29 |
| 2021/0288015 A1 | * | 9/2021 | Jang | H05K 1/189 |
| 2022/0013592 A1 | * | 1/2022 | Chen | H10K 50/8426 |
| 2022/0190075 A1 | * | 6/2022 | Murakami | H01L 24/83 |
| 2022/0199749 A1 | * | 6/2022 | Song | H01L 21/561 |
| 2022/0216172 A1 | * | 7/2022 | Shin | H01L 24/83 |

* cited by examiner

120: GE, CE1, GSL
130: CE2
140: SE, DE, ELVDDE, PAD
150: DL, CNE, ELVDDL

BSR

CB2

CB1

IV

IV'

ACF

BSR

CB2

CB1

DR3

DR2

DR1

DR4

DR5

ACF: CB1, CB2, BSR
CB: CB1, CB2

CB1

ACF_1: CB1, CB2, BSR

ACF_2: CB1, CB2, BSR

ANISOTROPIC CONDUCTIVE FILM AND DISPLAY DEVICE INCLUDING SAME

CROSS-REFERENCE TO RELATED APPLICATION(S)

This application claims priority to and benefits of Korean Patent Application No. 10-2022-0031678 under 35 U.S.C. § 119, filed on Mar. 14, 2022 in the Korean Intellectual Property Office, the entire contents of which are herein incorporated by reference.

BACKGROUND

1. Technical Field

The disclosure relates to an anisotropic conductive film and a display device including the same.

2. Description of Related Art

Display devices are increasing in importance under development of multimedia. In response to this trend, various types of display devices such as liquid crystal display devices (LCD), organic light-emitting display devices (OLED), etc. are being used.

A small semiconductor chip referred to as a display driver integrated circuit may be used to drive a display panel of the display device described above. The display driver integrated circuit may be attached to a substrate of the display panel in a scheme such as COG (Chip On Glass), COF (Chip on Film), and COP (Chip On Plastic) schemes.

The COF scheme refers to a scheme in which a flexible film of a thin film on which the display driver integrated circuit may be mounted is attached to the substrate of the display panel. Conductive particles may be interposed between the display panel and the flexible film to electrically connect the display panel and the flexible film to each other.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

A purpose of the disclosure is to provide a display device in which an anisotropic conductive film has different types of conductive particles and thus maintains a large contact area with and a bonding force to an electrode to secure low resistance characteristics and, at the same time, maintains contact with the electrode in an event of expansion of a resin due to moisture permeation into the resin to prevent a short circuit.

Purposes according to the disclosure are not limited to the above-mentioned purpose. Other purposes and advantages according to the disclosure that are not mentioned may be understood based on following descriptions, and may be more clearly understood based on embodiments according to the disclosure. Further, it will be understood that the purposes and advantages according to the disclosure may be realized using techniques shown in the claims and combinations thereof.

According to an embodiment of the disclosure, a display device may include a display panel that may include a first pad electrode and a second pad electrode, a printed circuit board including a first lead electrode and a second lead electrode facing the first pad electrode and the second pad electrode, respectively, and an anisotropic conductive film disposed between the display panel and the printed circuit board. The anisotropic conductive film may include a base resin, a plurality of first conductive balls dispersed in the base resin, each of the plurality of first conductive balls including a core made of a polymer material and at least one metal layer surrounding the core, and a plurality of second conductive balls dispersed in the base resin, each of the plurality of second conductive balls being made of a meltable material, and the anisotropic conductive film may have a first area in which the anisotropic conductive film overlaps the first pad electrode and the first lead electrode in a thickness direction of the display device, and a second area as an area disposed between the first lead electrode and the second lead electrode. Each of the metal layer of the first conductive ball and a surface of the second conductive ball may be in contact with both the first pad electrode and the first lead electrode.

In an embodiment, the first area may include at least one of the plurality of first conductive balls and at least one of the plurality of second conductive balls.

In an embodiment, the first conductive balls and the second conductive balls may be alternately arranged with each other, and the first conductive balls and the second conductive balls may be spaced from each other by a constant spacing.

In an embodiment, each of the first conductive balls and the second conductive balls included in the second area may not overlap the first pad electrode and the first lead electrode.

In an embodiment, a cross-sectional shape of at least one of the plurality of first conductive ball included in the first area, a cross-sectional shape of at least one of the plurality of second conductive ball included in the first area, a cross-sectional shape of at least one of the plurality of first conductive ball included in the second area, and a cross-sectional shape of at least one of the plurality of second conductive ball included in the second area may be different from each other.

In an embodiment, in a cross-sectional view of the display device, a cross-sectional shape of the at least one of the plurality of first conductive balls included in the first area may be an elliptical shape in which a diameter thereof in a first direction may be smaller than a diameter thereof in a second direction intersecting the first direction, and wherein in the cross-sectional view of the display device, a width in the second direction of the at least one of the plurality of second conductive balls included in the first area may increase as the at least one of the plurality of second conductive balls included in the first area extends from a middle vertical level thereof toward each of the lead electrode and the pad electrode.

In an embodiment, the cross-sectional shape of the at least one of the plurality of first conductive balls included in the second area may be round. The at least one of the plurality of first conductive balls included in the second area may include the core made of the polymer material and the at least one metal layer surrounding the core. The cross-sectional shape of at least one of plurality of the second conductive balls included in the second area may be round. The at least one of plurality of the second conductive balls included in the second area may be made of the meltable material.

In an embodiment, a number of the first conductive balls included in the first area and a number of the second conductive balls included in the first area may be equal to each other, and a number of the first conductive balls included in the second area and a number of the second conductive balls included in the second area may be different from each other.

In an embodiment, a number of the first conductive balls included in the first area and a number of the second conductive balls included in the first area may be different from each other, and a number of the first conductive balls included in the second area and a number of the second conductive balls included in the second area may be equal to each other.

In an embodiment, a thickness of a portion of the anisotropic conductive film located in the first area may be different from a thickness of a portion of the anisotropic conductive film located in the second area.

In an embodiment, the base resin may include a thermally-curable or photo-curable acrylic resin.

In an embodiment, the display device may further comprise a filling member filling the second area and being in contact with the anisotropic conductive film.

According to another embodiment of the disclosure, a display device may include a display panel including a first pad electrode and a second pad electrode, each having a long side extending in a first direction and a short side extending in a second direction intersecting the first direction, a printed circuit board including a first lead electrode and a second lead electrode facing the first pad electrode and the second pad electrode, respectively, each of the first lead electrode and the second lead electrode having a long side extending in the first direction and a short side extending in the second direction, and an anisotropic conductive film disposed between the display panel and the printed circuit board. The anisotropic conductive film may include a plurality of first conductive balls and a plurality of second conductive balls. Each of the plurality of first conductive balls may include a core made of a polymer material and at least one metal layer surrounding the core. Each of the plurality of second conductive balls may be made of a meltable material. The anisotropic conductive film may include a first group including a plurality of the first conductive balls arranged in a line in a third direction intersecting the first direction and the second direction and spaced apart from each other by an equal spacing, and a second group including a plurality of the second conductive balls arranged in a line in the third direction and spaced apart from each other by an equal spacing, wherein the first group and the second group extend in a parallel manner to each other. Each of at least one of the plurality of first conductive balls and at least one of the plurality of second conductive balls may be in contact with both the first pad electrode and the first lead electrode.

In an embodiment, spacing between adjacent ones of the plurality of first conductive balls, spacing between adjacent ones of the plurality of second conductive balls, and spacing between two adjacent first and second conductive balls may be equal to each other.

In an embodiment, a first angle may be defined between an arrangement axis passing through centers of the plurality of first conductive balls included in the first group and the long side of the first pad electrode or the second pad electrode. A first angle may be in a range of 0 degree excusive to 90 degrees inclusive in a plan view, a second angle may be defined between an arrangement axis passing through centers of the plurality of second conductive balls included in the second group and the long side of the first pad electrode or the second pad electrode, the second angle may be in a range of 0 degree excusive to 90 degrees inclusive in the plan view, and each of the first and second angles may satisfy a following Equation 1:

$$\theta \geq \sin^{-1}\left(\frac{P\ \cos\theta}{L}\right)$$

$$(W > \text{each of } d1 \text{ and } d2),$$

where θ refers to each of the first and second angles,

W denotes a size of the short side of each of the first and second pad electrodes in the second direction, L denotes a size of the long side of each of the first and second pad electrodes extending in the first direction, P denotes a sum of the size of the short side of each of the first and second pad electrodes extending in the second direction and a spacing in the second direction between the adjacent first and second pad electrodes, d1 denotes a spacing between the first conductive balls arranged in a line and closest to each other in the plan view, and d2 denotes a spacing between the second conductive balls arranged in a line and closest to each other in the plan view.

In an embodiment, the anisotropic conductive film may further include a third group including a plurality of the first conductive balls arranged in a line in the third direction and spaced apart from each other by an equal spacing. The third group may be disposed between the first group and the second group in case that the first, second and third groups extend in a parallel manner to each other.

In an embodiment, the anisotropic conductive film may further include a fourth group including a plurality of the second conductive balls arranged in a line in the third direction and spaced apart from each other by an equal spacing. The fourth group may be disposed between the first group and the second group in case that the first groups, second groups, and fourth groups extend in a parallel manner to each other.

According to yet another embodiment of the disclosure, an anisotropic conductive film may include a base resin including a thermally-curable or photo-curable acrylic resin, a plurality of first conductive balls dispersed in the base resin, each of the plurality of first conductive balls including a core made of a polymer material and at least one metal layer surrounding the core, and a plurality of second conductive balls dispersed in the base resin, each of the plurality of second conductive balls being made of a meltable material.

According to yet another embodiment of the disclosure, an anisotropic conductive film may include a plurality of first conductive balls, each of the plurality of first conductive balls including a core made of a polymer material and at least one metal layer surrounding the core, a plurality of second conductive balls, each of the plurality of second conductive balls being made of a meltable material, a plurality of first groups, each including a plurality of the first conductive balls arranged in a line in a third direction and spaced apart from each other by an equal spacing, the third direction intersecting a first direction as a vertical direction and a second direction as a horizontal direction perpendicular to the vertical direction, and a plurality of second groups, each including a plurality of the second conductive balls arranged in a line in the third direction and spaced apart from each other by an equal spacing. The first groups and the second groups may be alternately arranged with each other and extend in a parallel manner to each other.

In an embodiment, spacing between adjacent ones of the plurality of first conductive balls, spacing between adjacent ones of the plurality of second conductive balls, and spacing between two adjacent first and second conductive balls may be equal to each other.

According to the anisotropic conductive film and the display device including the same according to an embodiment, the anisotropic conductive film has different types of conductive particles and thus maintains a large contact area with and a bonding force to the electrode to secure low resistance characteristics and, at the same time, maintains contact with the electrode in an event of expansion of a resin due to moisture permeation into the resin to prevent a short circuit. In this way, reliability of the display device may be improved.

Effects according to embodiments are not limited to the contents above, and more various effects are included in the disclosure.

BRIEF DESCRIPTION OF DRAWINGS

The above and other aspects and features of the disclosure will become more apparent by describing in detail illustrative embodiments thereof with reference to the attached drawings, in which.

6

DETAILED DESCRIPTION OF THE EMBODIMENTS

Figure 1:
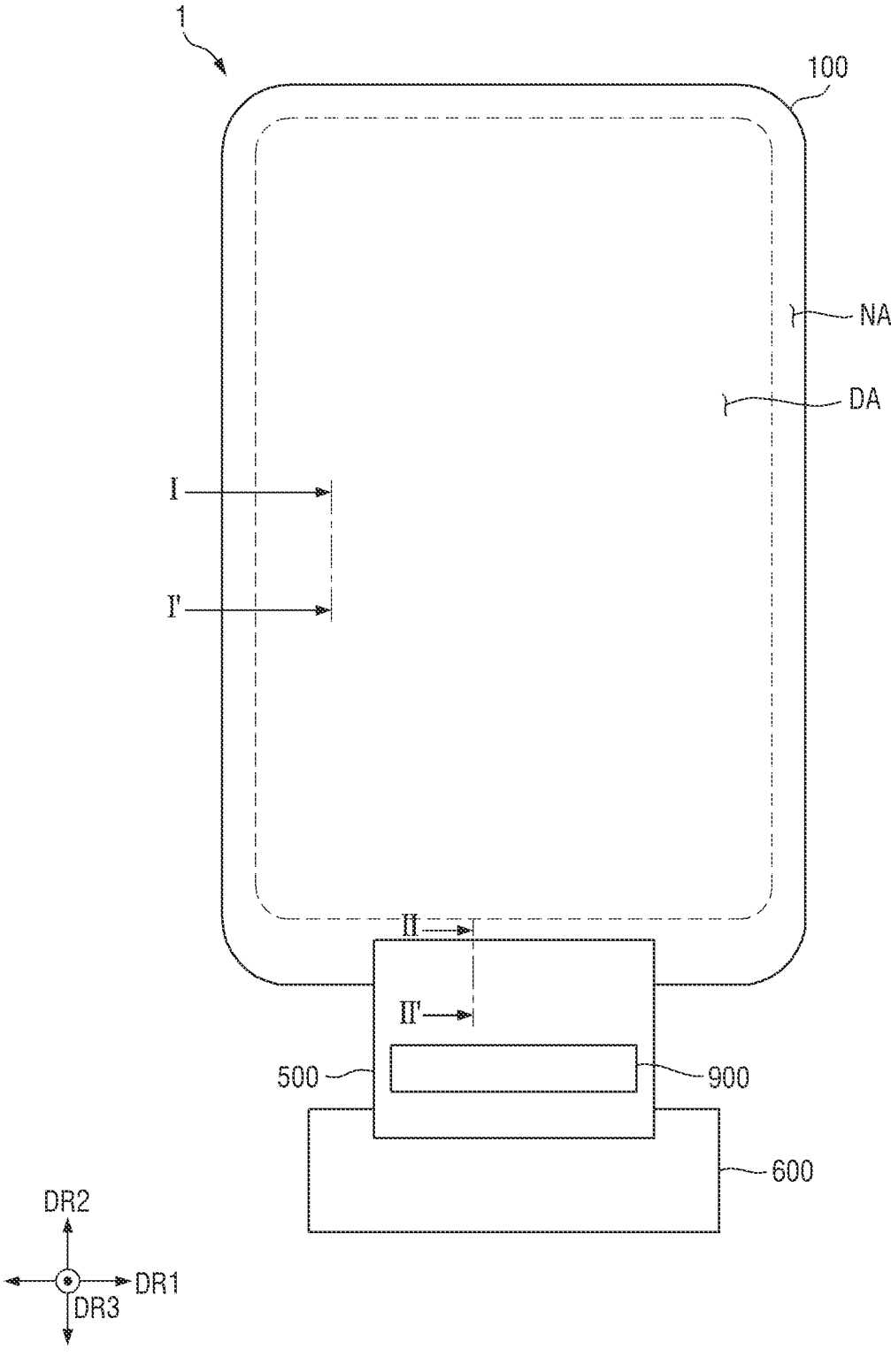
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the disclosure, numerous specific details are set forth in order to provide a thorough understanding of the disclosure. However, it will be understood that the disclosure may be practiced without these specific details. In other instances, well-known methods, procedures, components, and circuits have not been described in detail so as not to unnecessarily obscure aspects of the disclosure.

A shape, a size, a percentage, an angle, a number, etc. disclosed in the drawings for describing embodiments of the disclosure are illustrative, and the disclosure is not limited thereto.

The terminology used herein is for the purpose of describing particular embodiments only and is not intended to limit the disclosure. As used herein, the singular terms "a," "an," "the," and the like, are intended to include the plural forms as well, unless the context clearly indicates otherwise. It will be further understood that the terms "comprises", "comprising", "includes", "including," "has," "having," and the like, when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. The terms "and" and "or" may be used in the conjunctive or disjunctive sense and may be understood to be equivalent to "and/or." Expression such as "at least one of" when preceding a list of elements may modify the entirety of the list of elements and may not modify the individual elements of the list. For example, "at least one of A and B" may be understood to mean any combination including "A, B, or A and B." When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, a first component, a first region, a first layer or a first section described below could be termed a second element, a second component, a second region, a second layer or a second section, without departing from the spirit and scope of the disclosure.

In addition, it will also be understood that when a first element or layer is referred to as being "on" or "beneath" a second element or layer, the first element or layer may be disposed directly on or beneath the second element or layer or may be disposed indirectly on or beneath the second element or layer with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like may not be disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like may not be disposed between the former and the latter. It will be understood that the terms "connected to," "coupled to," and the like, may include a physical and/or electrical connection or coupling.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is indicated. The features of the various embodiments of the disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative terms used herein should be interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
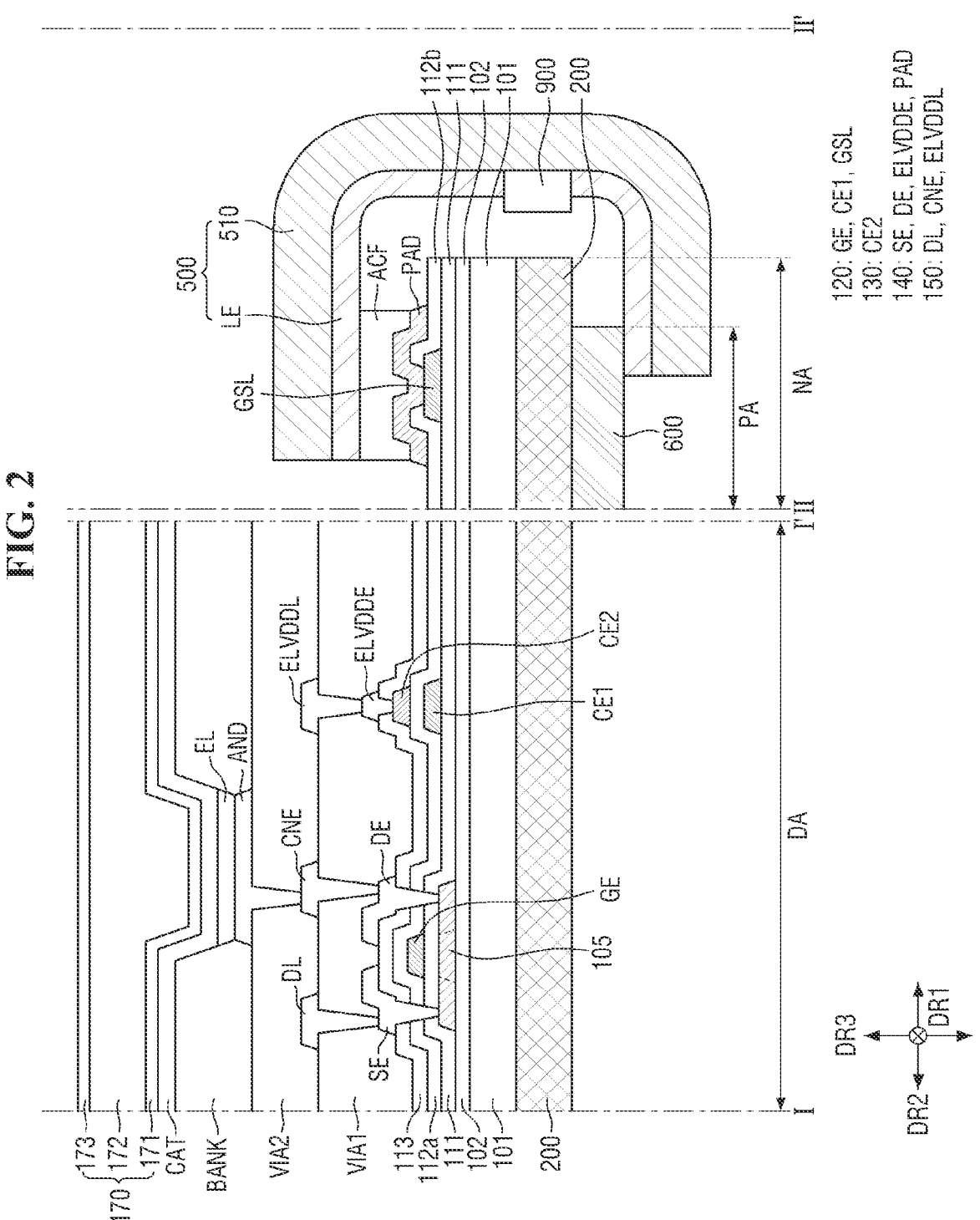
FIG. 2 is a schematic cross-sectional view taken along lines I-I' and of FIG. 1.

FIG. 1 is a schematic plan view of a display device according to an embodiment. FIG. 2 is a schematic cross-sectional view taken along lines I-I' and II-II' of FIG. 1.

In embodiments, a first direction DR1, a second direction DR2, and the third direction DR3 extend in different directions. The first direction DR1, the second direction DR2, and the third direction DR3 may intersect each other in a perpendicular manner. For example, the first direction DR1 may be a horizontal direction, a second direction DR2 may be a vertical direction in a plan view and the third direction DR3 may be a thickness direction in a cross sectional view. Each of the first direction DR1, the second direction DR2, and/or the third direction DR3 may include two or more directions. For example, in the cross-sectional view, the third direction DR3 may include an upward direction and a downward direction. A face of a member disposed to face in the upward direction may be referred to as a top face, and another face of the member disposed to face in the downward direction may be referred to as a bottom face. However, the directions are illustrative and relative, and are not limited thereto.

The display device 1 displays a moving image or a still image. The display device 1 according to an embodiment may be applied to a portable electronic device such as a mobile phone, a smart phone, a tablet personal computer (tablet PC), a mobile communication terminal, an electronic notebook, an electronic book, portable multimedia player (PMP), navigation, Ultra Mobile PC (UMPC), etc. In other embodiments, the display device 1 according to an embodiment may be applied as a display unit of a television, a laptop computer, a monitor, a billboard, or an Internet of Things (IoT) device.

Referring to FIG. 1, the display device 1 may include a display panel 100 for displaying an image, a printed circuit board 500 connected to the display panel 100, and a main circuit board 600 connected to the printed circuit board 500.

The display panel 100 may be, for example, an organic light-emitting display panel. Hereinafter, an example in which the organic light-emitting display panel acts as the display panel 100 is described. However, the disclosure is not limited thereto. For example, the display panel 100 may be embodied as different types of display panels such as a liquid crystal display (LCD) panel, a quantum dot organic light-emitting display (QD-OLED) panel, a quantum dot liquid crystal display (QD-LCD) panel, a quantum nano light-emitting display (Nano LED) panel, a micro light-emitting diode (LED) panel, etc.

The display panel 100 may include a display area DA including pixels, and a non-display area NA disposed around the display area DA.

The display area DA may have a rectangular shape with right or rounded corners in a plan view. The display area DA may have a short side and a long side. The short side of the display area DA may be a side extending in the first direction DR1. The long side of the display area DA may be a side extending in the second direction DR2. However, a planar shape of the display area DA is not limited to a rectangle, and may have a circular shape, an oval shape, or various other shapes.

The non-display area NA may be disposed adjacent to both short sides and both long sides of the display area DA. The non-display area NA may surround all sides of the display area DA and may act as an area out of the display area DA. However, the disclosure is not limited thereto, and the non-display area NA may be disposed adjacent to both short sides or both long sides of the display area DA.

The printed circuit board 500 may be connected to the non-display area NA of the display panel 100. A side of the printed circuit board 500 may be connected to the display panel 100, and another side of the printed circuit board 500 may be connected to the main circuit board 600. For example, as shown in FIG. 1, in a plan view, an upper side of the printed circuit board 500 may be attached to a lower short side of the display panel 100, and a lower side of the printed circuit board 500 may be attached to an upper side of the main circuit board 600. However, the disclosure is not limited thereto, and the printed circuit board 500 may be attached to an upper short side, a left long side, or a right long side of the display panel 100.

A driver integrated circuit 900 may be disposed on the printed circuit board 500. The driver integrated circuit 900 may include a display driver integrated circuit that drives the pixels of the display area DA. The driver integrated circuit 900 may be mounted on the printed circuit board 500 in a chip-on-film scheme. However, the disclosure is not limited thereto. The driver integrated circuit 900 may be mounted thereon in a chip-on-glass or chip-on-plastic scheme.

The main circuit board 600 may be connected to the printed circuit board 500. For example, as shown in FIG. 1, in a plan view, an upper side of the main circuit board 600 may be connected to a lower side of the printed circuit board 500.

Referring to FIG. 2, the printed circuit board 500 may be bent in the third direction DR3, specifically, the downward direction. Another side of the printed circuit board 500 and the main circuit board 600 connected thereto may be located on the bottom face of a panel underlying sheet 200.

The display device 1 (see FIG. 1) may further include the panel underlying sheet 200 disposed on a bottom face of the display panel 100 (see FIG. 1). The panel underlying sheet 200 may be attached to the bottom face of the display panel 100. The panel underlying sheet 200 may include at least one functional layer.

The functional layer may be a layer that performs a heat dissipation function, an electromagnetic wave shielding function, a grounding function, a shock absorbing function, a strength reinforcement function, a support function, and/or a digitizing function. The functional layer may be embodied as a sheet layer, a film layer, a thin film layer, a plate, or the like.

The display panel 100 may include a first substrate 101, conductive layers, insulating layers, and an organic layer EL.

The first substrate 101 may be disposed over an entirety of the display area DA and the non-display area NA. The first substrate 101 may function to support several components disposed thereon. In an embodiment, the first substrate 101 may be embodied as a flexible substrate including a flexible material such as polyimide (PI).

A buffer layer 102 may be disposed on the first substrate 101. The buffer layer 102 may block permeation of moisture and oxygen into an inside of the display panel 100 from an outside of the first substrate 101. The buffer layer 102 may include any one of a silicon nitride ($SiN_x$) film, a silicon oxide ($SiO_2$) film, and a silicon oxynitride ($SiO_xN_y$) film.

A semiconductor layer 105 may be disposed on the buffer layer 102. The semiconductor layer 105 constitutes a channel of a thin film transistor. The semiconductor layer 105 may be disposed in each pixel of the display area DA. In some cases, the semiconductor layer 105 may be disposed in the non-display area NA. The semiconductor layer 105 may include a source/drain area and an active area. The semiconductor layer 105 may include polycrystalline silicon.

A first insulating layer 111 may be disposed on the semiconductor layer 105. The first insulating layer 111 may be disposed over an entire face of the first substrate 101. The first insulating layer 111 may be embodied as a gate insulating film having a gate insulating function. The first insulating layer 111 may include a silicon compound, metal oxide, or the like. For example, the first insulating layer 111 may include silicon oxide, silicon nitride, silicon oxynitride, aluminum oxide, tantalum oxide, hafnium oxide, zirconium oxide, titanium oxide, and the like. These materials may be used alone or in combination with each other.

A first conductive layer 120 may be disposed on the first insulating layer 111. The first conductive layer 120 may include a gate electrode GE of the thin film transistor, a first electrode CE1 of a storage capacitor, and a signal line GSL.

The first conductive layer 120 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 120 may be embodied as a single film made of each of the above-mentioned materials or a stack of layers made of the above-mentioned materials.

Second insulating layers 112a and 112b may be disposed on the first conductive layer 120. The second insulating layers 112a and 112b may electrically insulate a first conductive layer 120 and a second conductive layer 130 from each other. The second insulating layer 112a may be generally disposed in the display area DA, while the second insulating layer 112b may be generally disposed in the non-display area NA. The second insulating layers 112a and 112*b* may be made of at least one selected from the materials discussed regarding the first insulating layer 111.

In the non-display area NA, the second insulating layer 112*b* may partially expose the signal line GSL. In FIG. 2, it is illustrated that one contact hole is formed in the second insulating layer 112*b*. However, the disclosure is not limited thereto, and multiple contact holes may be formed therein.

A second conductive layer 130 may be disposed on the second insulating layers 112*a* and 112*b*. The second conductive layer 130 may include a second electrode CE2 of the storage capacitor. A material of the second conductive layer 130 may be selected from among the materials as described above regarding the first conductive layer 120. The first electrode CE1 of the storage capacitor, the second electrode CE2 of the storage capacitor, and the second insulating layers 112*a* and 112*b* may constitute a capacitor.

A third insulating layer 113 may be disposed on the second conductive layer 130. The third insulating layer 113 may include at least one of the materials as described above regarding the first insulating layer 111. In some embodiments, the third insulating layer 113 may include an organic insulating material. The organic insulating material may be selected from example materials of a first via layer VIA1 to be described later.

A third conductive layer 140 may be disposed on the third insulating layer 113. The third conductive layer 140 may include a source electrode SE, a drain electrode DE, a high potential voltage electrode ELVDDE, and a pad electrode PAD. The third conductive layer 140 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), germanium (Ge), and copper (Cu). The third conductive layer 140 may be embodied as a single film made of each of the discussed materials. The disclosure is not limited thereto, and the third conductive layer 140 may be embodied as a stack of multilayers. For example, the third conductive layer 140 may be embodied as a stacked structure of Ti/Al/Ti, Mo/Al/Mo, Mo/AlGe/Mo, Ti/Cu, or the like. In an embodiment, the third conductive layer 140 may include Ti/Al/Ti.

The pad electrode PAD of the third conductive layer 140 may overlap the signal line GSL of the first conductive layer 120 in the thickness direction, and may be electrically connected to the signal line GSL via a contact hole of the second insulating layer 112*b*.

The signal line GSL may transmit an electrical signal for driving the pixels arranged in the display area DA. The signal line GSL may be electrically connected to at least one of the conductive layers 120, 130, 140, and 150 disposed in the display area DA. In FIG. 2, it is shown that the signal line GSL is disposed only in the non-display area NA. However, a shape or arrangement of the signal line GSL is not limited thereto. The signal line GSL may be disposed over the display area DA and the non-display area NA.

The first via layer VIA1 may be disposed on the third conductive layer 140. The first via layer VIA1 may include an organic insulating material. The organic insulating material may include at least one of polyacrycate resins, epoxy resin, phenolic resin, polyamide resins, polyimides resins, unsaturated polyester resins, poly phenyleneether resins, polyphenylenesulfide resins, and benzocyclobutene (BCB).

In one example, upper structures of the third insulating layer 113 and the third conductive layer 140 may be removed or omitted from the non-display area NA in which the pad electrode PAD may be disposed so that the pad electrode PAD may be exposed.

A fourth conductive layer 150 may be disposed on the first via layer VIA1. The fourth conductive layer 150 may include a data line DL, a connection electrode CNE, and a high potential voltage line ELVDDL. The data line DL may be electrically connected to the source electrode SE of the thin film transistor via a contact hole extending through the first via layer VIA1. The connection electrode CNE may be electrically connected to the drain electrode DE of the thin film transistor via a contact hole extending through the first via layer VIA1. The high potential voltage line ELVDDL may be electrically connected to the high potential voltage electrode ELVDDE via a contact hole extending through the first via layer VIAL The fourth conductive layer 150 may include a material selected from the materials as listed above regarding the third conductive layer 140.

A second via layer VIA2 may be disposed on the fourth conductive layer 150. The second via layer VIA2 may include at least one of the materials as described above regarding the first via layer VIA1.

An anode electrode AND may be disposed on the second via layer VIA2. The anode electrode AND may be electrically connected to the connection electrode CNE via a contact hole extending through the second via layer VIA2.

A bank layer BANK may be disposed on the anode electrode AND. The bank layer BANK may have an opening defined therein exposing the anode electrode AND. The bank layer BANK may be made of an organic insulating material or an inorganic insulating material. For example, the bank layer BANK may made of at least one of photoresist, polyimide-based resin, acrylic resin, silicon compound, polyacrylic resin, and the like.

An organic layer EL may be disposed on a top face of the anode electrode AND and may be received in the opening of the bank layer BANK. A cathode electrode CAT may be disposed on the organic layer EL and the bank layer BANK. The cathode electrode CAT may be a common electrode disposed over multiple pixels.

A thin film encapsulation layer 170 may be disposed on the cathode electrode CAT. The thin film encapsulation layer 170 may cover the organic layer EL. The thin film encapsulation layer 170 may be embodied as a multilayer film in which an inorganic film and an organic film may be alternately stacked. For example, the thin film encapsulation layer 170 may include a first encapsulating inorganic layer 171, an encapsulating organic layer 172, and a second encapsulating inorganic layer 173 which may be sequentially stacked.

The printed circuit board 500 may include a base film 510 and a lead electrode LE. The lead electrode LE may be electrically connected to the pad electrode PAD.

The lead electrode LE may include a metal material. For example, the lead electrode LE may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

An anisotropic conductive film ACF may be interposed between the lead electrode LE and the signal line GSL. The lead electrode LE may be electrically connected to an exposed top face of the pad electrode PAD via the anisotropic conductive film ACF. A detailed description of the anisotropic conductive film ACF will be made later in conjunction with FIG. 6 and FIG. 7.

In one example, a stack structure and a shape of the signal line GSL and the pad electrode PAD in a panel pad area PA may be modified.

For example, in some embodiments, the signal line GSL may include multiple patterns, and the pad electrode PAD disposed on the signal line GSL may have a surface unevenness based on a step of the pattern of the signal line GSL.

In some embodiments, an auxiliary pad of the second conductive layer 130 may be further disposed between the signal line GSL and the pad electrode PAD. A size in a plan view of the auxiliary pad may be smaller than a size in a plan view of the pad electrode PAD. The pad electrode PAD, the auxiliary pad, and the signal line GSL may be electrically connected to each other while overlapping each other in the thickness direction.

Further, in some embodiments, the signal line GSL may be composed of the second conductive layer 130, and the pad electrode PAD may be composed of the fourth conductive layer 150.

Figure 3:
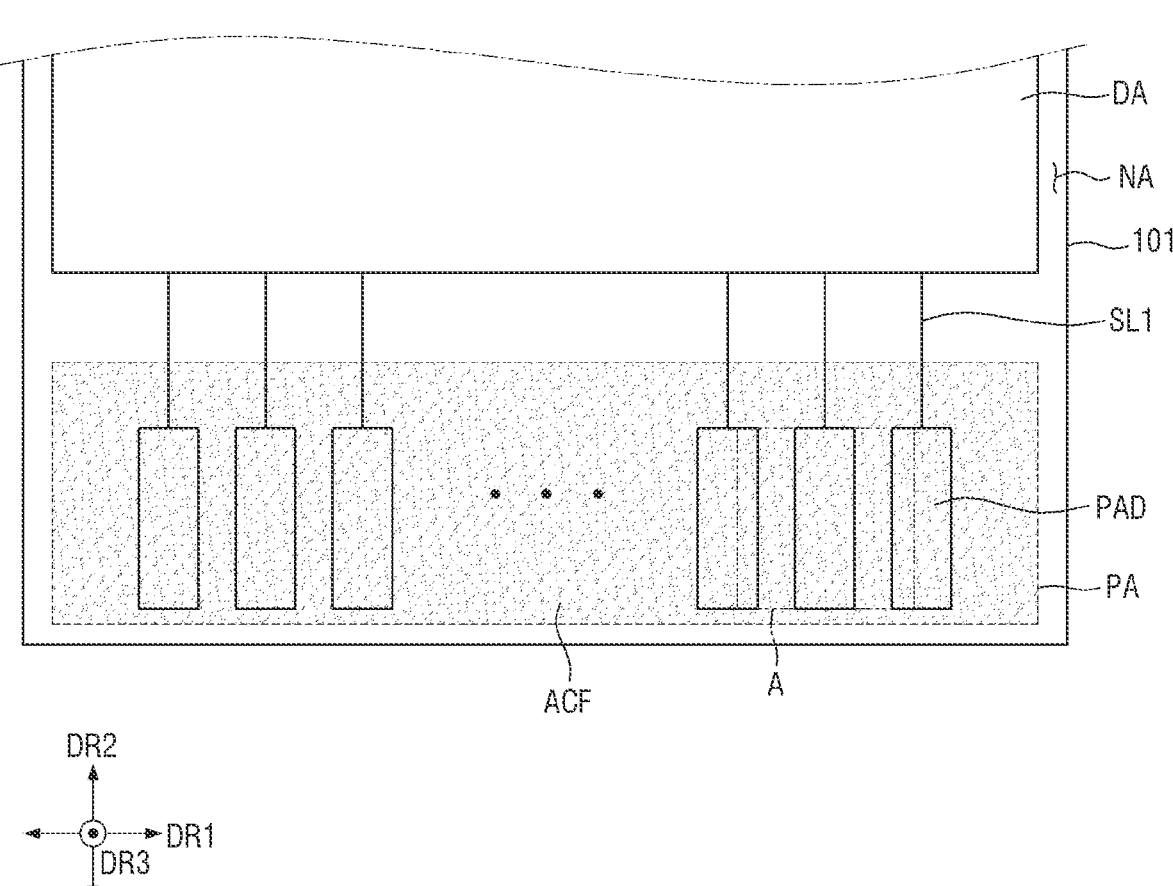
FIG. 3 is an enlarged schematic plan view of a portion of a display panel according to an embodiment.
Figure 4:
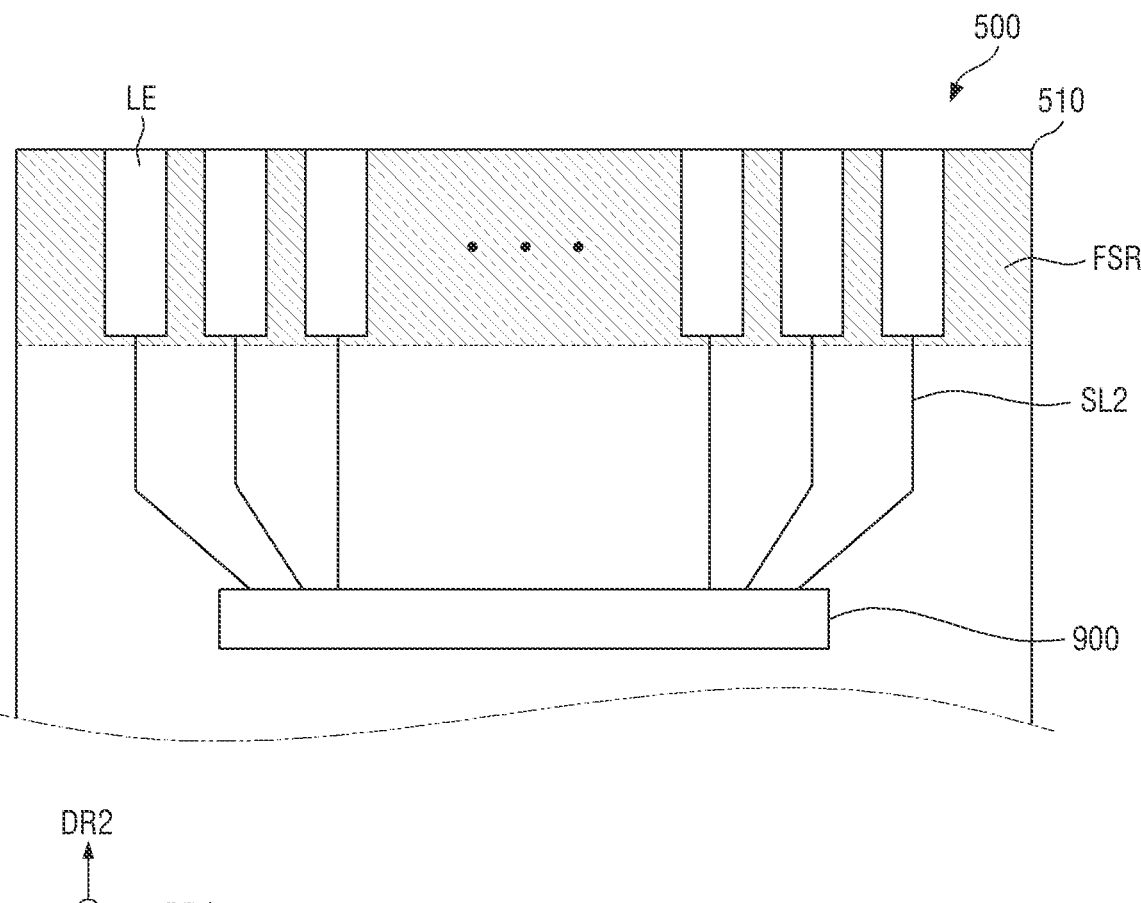
FIG. 4 is an enlarged schematic plan view of a portion of a printed circuit board according to an embodiment.
Figure 5:
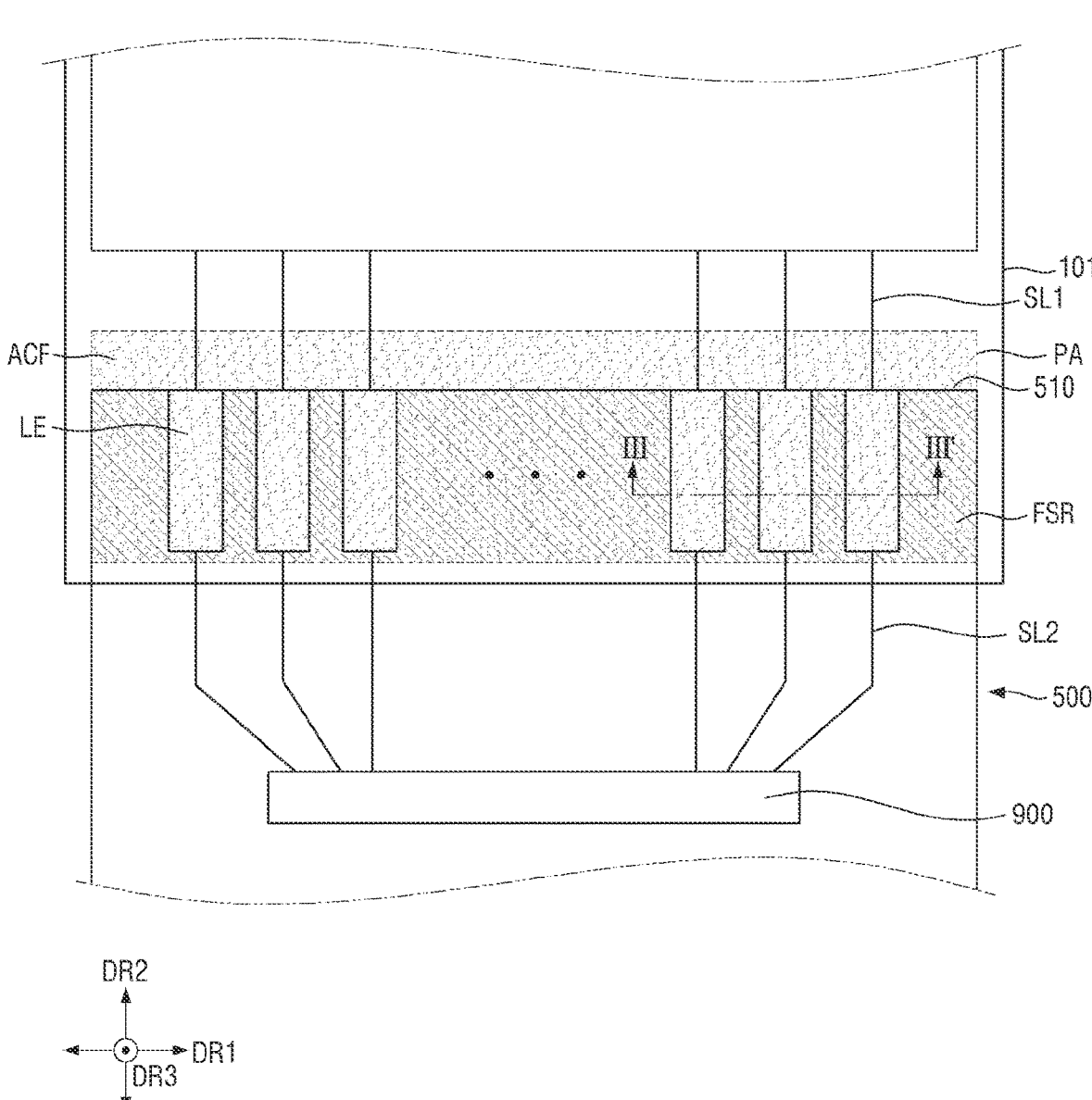
FIG. 5 is a schematic plan view showing that the printed circuit board of FIG. 4 is attached to the display panel of FIG. 3.

FIG. 3 is an enlarged schematic plan view of a portion of a display panel according to an embodiment. FIG. 4 is an enlarged schematic plan view of a portion of a printed circuit board according to an embodiment. FIG. 5 is a schematic plan view showing that the printed circuit board of FIG. 4 is attached to the display panel of FIG. 3.

Referring to FIG. 3, multiple pad electrodes PAD may be disposed in the panel pad area PA. The pad electrodes PAD may be arranged along the first direction DR1. In FIG. 3, it is shown that the pad electrodes PAD arranged in the first direction DR1 constitute one pad row. However, the disclosure is not limited thereto, and the pad electrodes PAD may constitute multiple pad rows.

Hereinafter, an example in which the pad electrodes PAD constitute one pad row will be described. A gate signal line SL1 may serve to electrically connect the pad electrode PAD and a light-emitting element of the display area DA to each other. A width of the first direction DR1 of the pad electrode PAD may be larger than that of the gate signal line SL1.

The anisotropic conductive film ACF may be disposed on the pad electrodes PAD. In a plan view, the anisotropic conductive film ACF may cover the pad row of the pad electrodes PAD and may overlap therewith. The pad electrode PAD may be connected to the display area DA via the gate signal line SL1. A planar shape of the pad electrode PAD may be a rectangular shape. The anisotropic conductive film ACF may extend beyond one short side of each of the pad electrodes PAD adjacent to the display area DA and beyond the opposite short side opposite to said one short side in the second direction DR2, and may extend beyond the leftmost pad electrode PAD and the rightmost pad electrode PAD in the first direction DR1.

The anisotropic conductive film ACF may not be cured before bonding between the display panel 100 and the printed circuit board 500, but may be heat-cured or ultraviolet (UV) cured after the printed circuit board 500 has been placed on the display panel 100.

Referring to FIG. 4, the lead electrode LE may have a rectangular shape in a plan view. The planar shape of the lead electrode LE may be substantially the same as that of the pad electrode PAD (see FIG. 3).

The lead electrode LE may be connected to the driver integrated circuit 900 via a lead connection line SL2. The lead connection line SL2 may be integrally formed with the lead electrode LE. The lead electrode LE may have a larger width in the first direction DR1 than that of the lead connection line SL2.

A filling member FSR may be further disposed in an area between adjacent ones of multiple lead electrodes LE arranged along the first direction DR1.

Specifically, in a plan view, the filling member FSR may not surround a short side of the lead electrode LE at an end of the printed circuit board 500 and may surround long sides of the lead electrode LE and the other short side opposite to said one short side thereof.

The filling member FSR may include an optically opaque insulating resin. However, the disclosure is not limited thereto.

The filling member FSR may serve to prevent a short circuit between adjacent lead electrodes LE, and at the same time, may fill a space defined by the base film 510, the lead electrode LE, and the anisotropic conductive film ACF (see FIG. 5) in case that the display panel 100 (see FIG. 5) and the printed circuit board 500 are bonded to each other, such that adhesion between the printed circuit board 500 and the first substrate 101 (see FIG. 5) may be improved.

Referring to FIG. 5, in the third direction DR3, the pad electrodes PAD (see FIG. 3) included in the panel pad area PA may overlap the lead electrodes LE included in the printed circuit board 500 while the anisotropic conductive film ACF may be interposed therebetween.

Specifically, the anisotropic conductive film ACF may be disposed between the printed circuit board 500 and the pad area PA, and may electrically connect the pad electrodes PAD of the pad area PA and the lead electrodes LE of the printed circuit board 500 to each other. Therefore, an electrical signal transmitted from the printed circuit board 500 may be transmitted to the pad area PA via the anisotropic conductive film ACF.

In case that the display panel 100 and the printed circuit board 500 are bonded to each other, the filling member FSR may be in direct contact with a side face of the lead electrode LE and at the same time, be in direct contact with the anisotropic conductive film ACF. A vertical dimension between a surface of the filling member FSR and the base film 510 may be smaller or larger than or equal to a vertical dimension between the base film 510 and a surface of the lead electrode LE.

Figure 6:
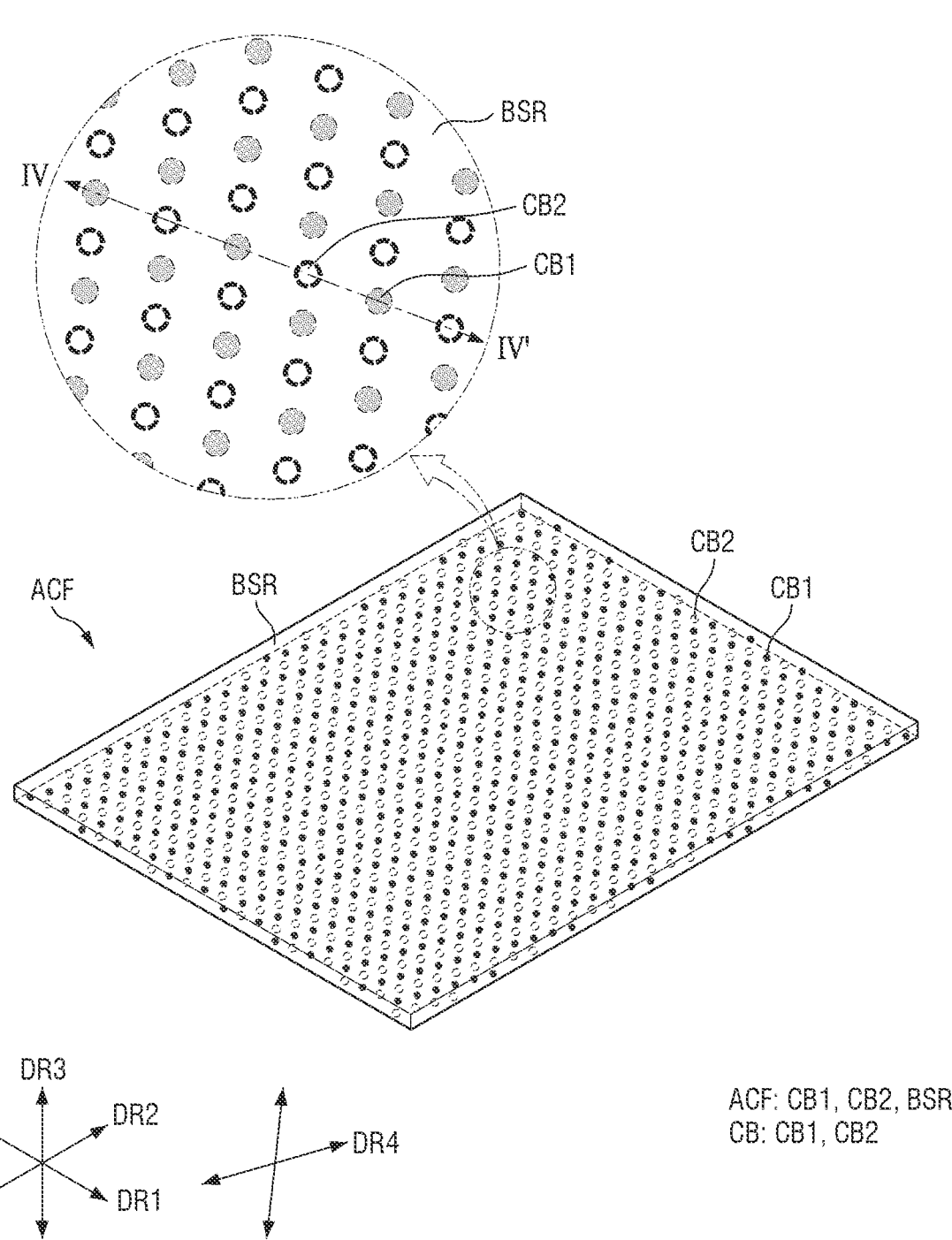
FIG. 6 is a schematic perspective view of an anisotropic conductive film according to an embodiment.
Figure 7:
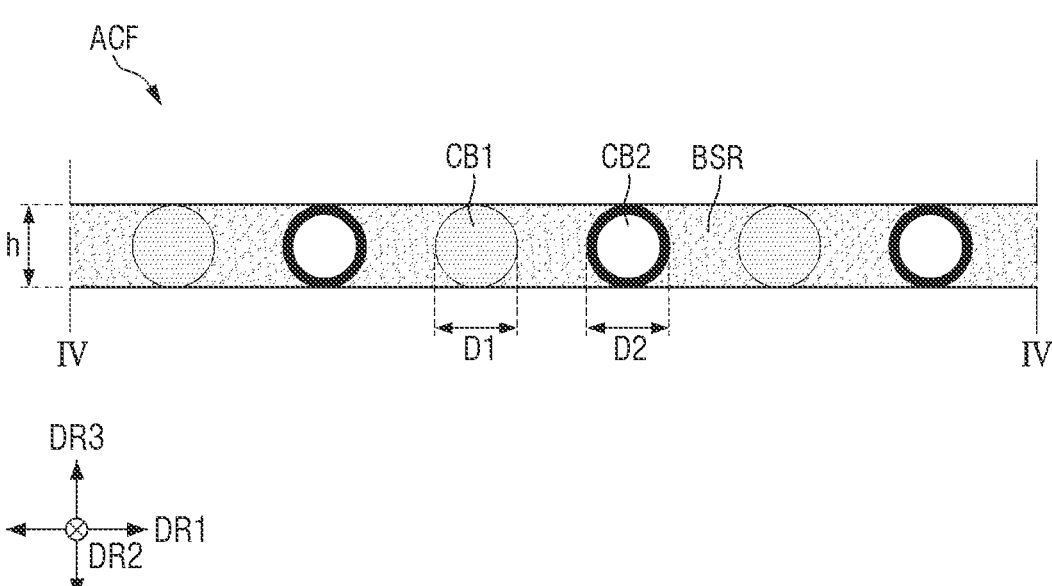
FIG. 7 is a schematic cross-sectional view taken along a line IV-IV' of FIG. 6 of an anisotropic conductive film according to an embodiment.
Figure 8:
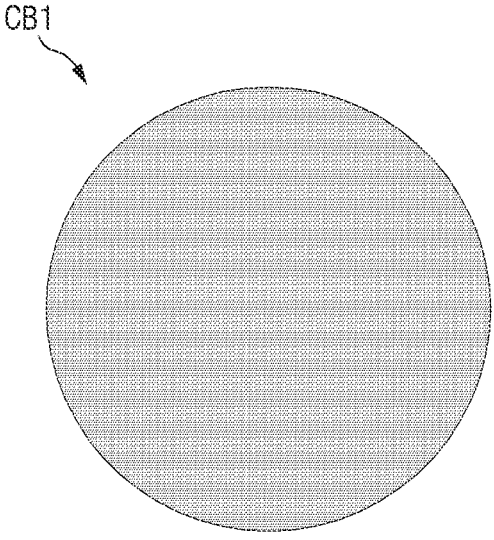
FIG. 8 is a schematic cross-sectional view of a first conductive ball according to an embodiment.

FIG. 6 is a schematic perspective view of an anisotropic conductive film according to an embodiment. FIG. 7 is a schematic cross-sectional view taken along a line IV-IV' of FIG. 6 of an anisotropic conductive film according to an embodiment. FIG. 8 is a schematic cross-sectional view of a first conductive ball according to an embodiment. FIG. 9 to FIG. 14 are schematic cross-sectional views of second conductive balls according to various embodiments.

Referring to FIG. 6, the anisotropic conductive film ACF may include a bonding resin layer BSR (also referred to as a base resin), multiple first conductive balls CB1, and multiple second conductive balls CB2 dispersed in the bonding resin layer BSR. A first conductive ball CB1 and a second conductive ball CB2 may have different cross-sectional structures. A detailed description of the cross-sectional structures of the first conductive ball CB1 and the second conductive ball CB2 will be made later in conjunction with FIG. 8 to FIG. 14.

Referring to FIG. 6, the anisotropic conductive film ACF may include multiple first groups and multiple second groups, wherein each of the first groups includes first conductive balls CB1 spaced apart from each other and arranged in a line along a fourth direction DR4 intersecting the first direction DR1 and the second direction DR2, and each of the second groups includes second conductive balls CB2 spaced apart from each other and arranged in a line along the fourth direction DR4, wherein the first groups and the second groups are spaced apart from each other in a fifth direction DR5 intersecting the fourth direction DR4 and are alternately arranged in the fifth direction DR5 and extend in a parallel manner with each other.

A detailed description of the arrangement of the first conductive balls CB1 and the second conductive balls CB2 will be made later in conjunction with FIG. 15.

Referring to FIG. 7, the first conductive balls CB1 and the second conductive balls CB2 may be disposed in the same layer and alternately arranged along the first direction DR1 to constitute a single layer.

In FIG. 7, it is shown that the first conductive balls CB1 and the second conductive balls CB2 may be alternately arranged with each other and may be spaced from each other by a constant spacing. However, the disclosure is not limited thereto. In some embodiments, the first conductive balls CB1 and the second conductive balls CB2 may be arranged alternately with each other along the first direction DR1 and may be spaced from each other at different spacings.

In an embodiment, a thickness h of the bonding resin layer BSR surrounding the first conductive balls CB1 and the second conductive balls CB2 may be substantially equal to each of a diameter D1 of the first conductive ball CB1 and the diameter D2 of the second conductive ball CB2. Therefore, a surface of each of the first conductive ball CB1 and the second conductive ball CB2 may be surrounded with the bonding resin layer BSR. The surface of each of the first conductive ball CB1 and the second conductive ball CB2 may not protrude beyond each of top and bottom faces of the anisotropic conductive film ACF.

However, the disclosure is not limited thereto. In some embodiments, a thickness h of the bonding resin layer BSR may be greater than each of the diameter D1 of the first conductive ball CB1 and the diameter D2 of the second conductive ball CB2. A space may be defined between each of the top face and the bottom face of the anisotropic conductive film ACF and a surface of each of the first conductive ball CB1 and the second conductive ball CB2.

In FIGS. 6 and 7, it is shown that the diameter D1 of the first conductive ball CB1 and the diameter D2 of the second conductive ball CB2 which may be dispersed in the bonding resin layer BSR may be equal to each other. However, the disclosure is not limited thereto. In some embodiments, the diameter D1 of the first conductive ball CB1 and the diameter D2 of the second conductive ball CB2 may be different from each other.

In an embodiment, the bonding resin layer BSR may be made of an insulating material. The bonding resin layer BSR may be made of a thermoplastic resin such as styrene butadiene resin or polyvinyl butylene resin, or a thermosetting resin such as an epoxy resin, a polyurethane resin, an acrylic resin, or a combination thereof.

Further, the bonding resin layer BSR may be made of an ultraviolet-curable resin such as epoxy acrylate, urethane acrylate, unsaturated polyester resin, polyester acrylate, polyether acrylate, unsaturated acrylic resin, or a combination thereof.

In an embodiment, the bonding resin layer BSR may have a viscosity of about 500 cps to about 1000 cps at about 25° C. before curing. For example, the viscosity before curing of the bonding resin layer BSR may be about 600 cps. However, the disclosure is not limited thereto.

Therefore, in case that, as described above, the thickness h of the bonding resin layer BSR is substantially equal to each of the diameter D1 of the first conductive ball CB1 and the diameter D2 of the second conductive ball CB2, a space between a surface of each of the first conductive balls CB1 and the second conductive balls CB2 contained in the anisotropic conductive film ACF and the lead electrodes LE (see FIG. 5) and the pad electrodes PAD (see FIG. 3) may be minimized. Thus, in case that the surfaces of the first conductive balls CB1 and the second conductive balls CB2 bond to and contact the electrodes LE and the pad electrodes PAD, contact resistance therebetween may be minimized.

Figure 16:
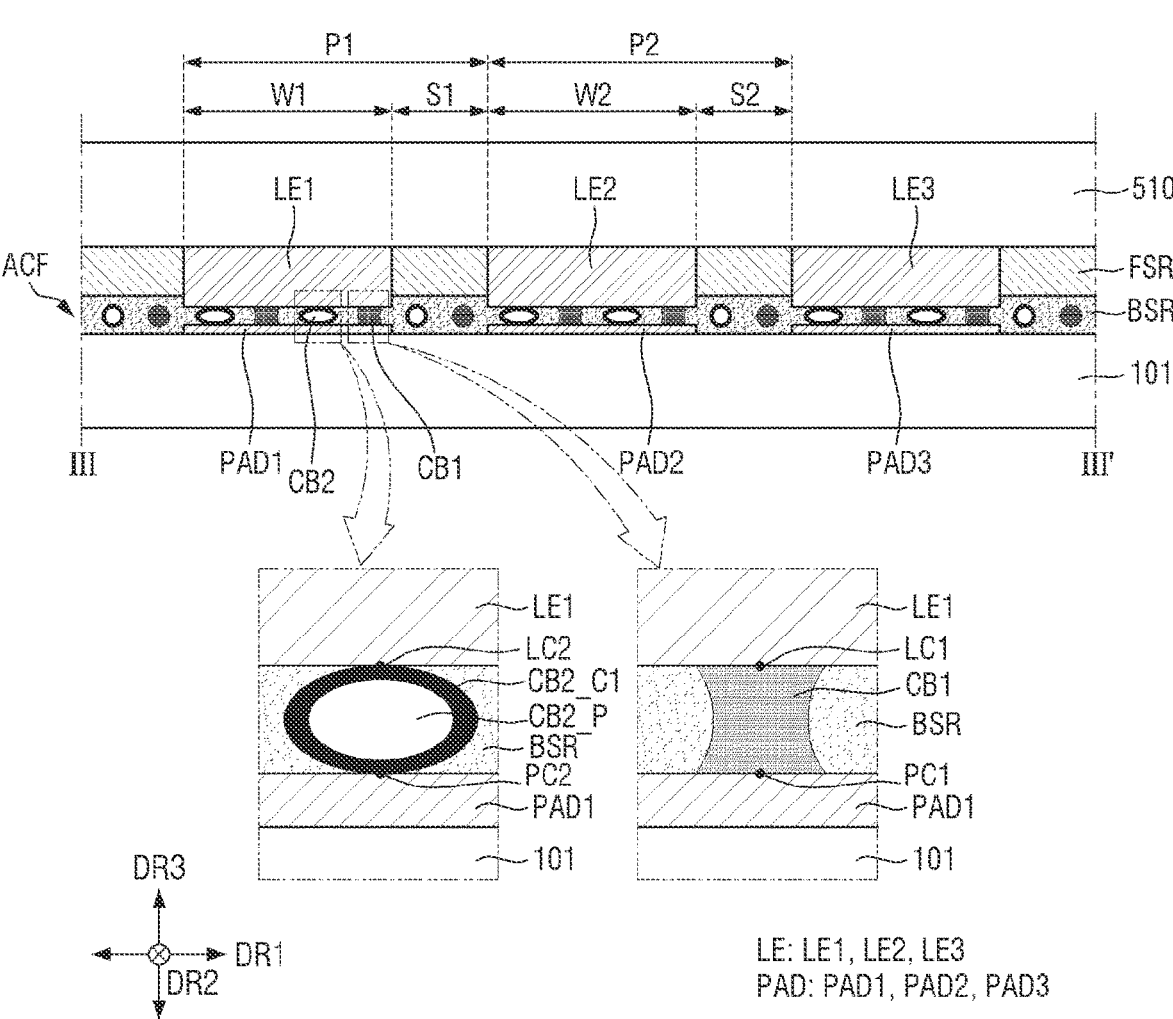
FIG. 16 is a schematic cross-sectional view taken along a line of FIG. 5 according to an embodiment.

In FIG. 8 to FIG. 14, cross-sections of the first conductive ball CB1 and the second conductive ball CB2 contained in the anisotropic conductive film ACF before the first conductive ball CB1 and the second conductive ball CB2 are pressed between the lead electrode LE and the pad electrode PAD are shown. As shown in FIG. 16 to be described later, in a state after the first conductive ball CB1 is pressed, a shape of the first conductive ball CB1 and a thickness of a layer composed of the same may be changed.

Referring to FIG. 8, unlike the second conductive ball CB2 (see FIG. 9) which will be described later, the first conductive ball CB1 may be embodied as a particle made of a meltable material such as a solder material and free of a polymer particle CB2_P (see FIG. 9) as a core. For example, the meltable material may include at least one of zinc, gold, silver, lead, copper, tin, bismuth, indium, and the like. However, the disclosure is not limited thereto.

Figure 9:
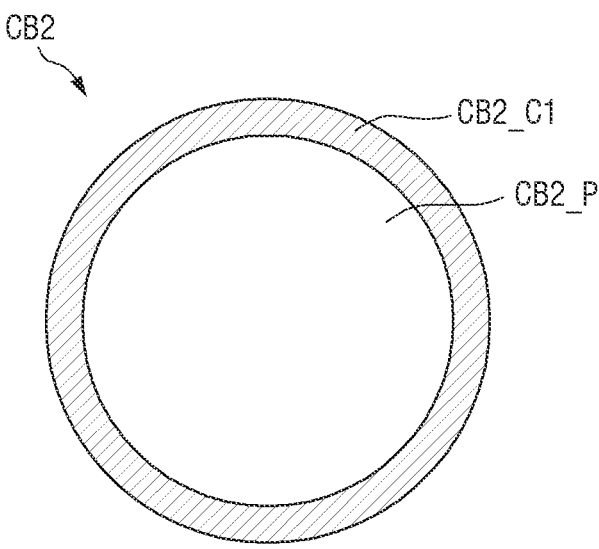
FIG. 9 to FIG. 14 are schematic cross-sectional views of second conductive balls according to various embodiments.

Referring to FIG. 9, in an embodiment, the second conductive ball CB2 may include the polymer particle CB2_P as a core and a first metal layer CB2_C1 coated on the core. Before the second conductive ball CB2 may be pressed, the first metal layer CB2_C1 may be disposed on the polymer particle CB2_P at a uniform thickness thereof. The first metal layer CB2_C1 may be formed on the polymer particle CB2_P so as to have a smooth outer face.

Figure 10:
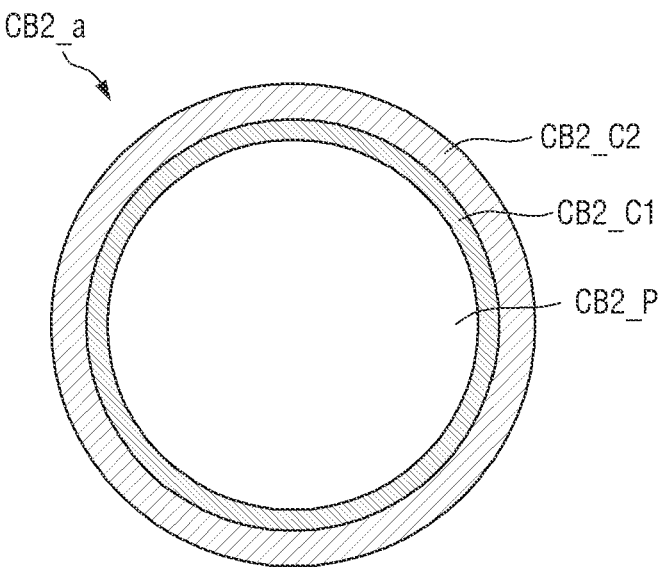

Referring to FIG. 10, in some embodiments, a second conductive ball CB2_a may include the polymer particle CB2_P, the first metal layer CB2_C1 coated on the polymer particle CB2_P, and a second metal layer CB2_C2 coated on the first metal layer CB2_C1.

In some embodiments, the first metal layer CB2_C1 and the second metal layer CB2_C2 may be made of different metals. For example, the first metal layer CB2_C1 may be made of nickel, and the second metal layer CB2_C2 may be made of gold. However, the disclosure is not limited thereto. In a similar manner to the first metal layer CB2_C1 shown in FIG. 9, an outer face of the second metal layer CB2_C2 may be formed to be smooth.

Figure 11:
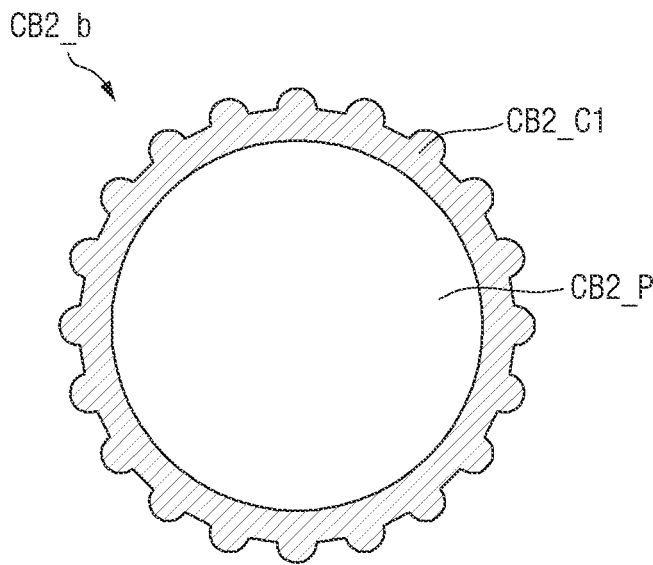

Referring to FIG. 11, in some embodiments, a second conductive ball CB2_b may include the polymer particles CB2_P and the first metal layer CB2_C1, wherein multiple protrusions or irregularities may be formed on an outer face of the first metal layer CB2_C1. As the protrusions may be formed on the outer face of the first metal layer CB2_C1, the second conductive ball CB2_b may be more stably seated on the pad electrode PAD (see FIG. 3).

Figure 12:
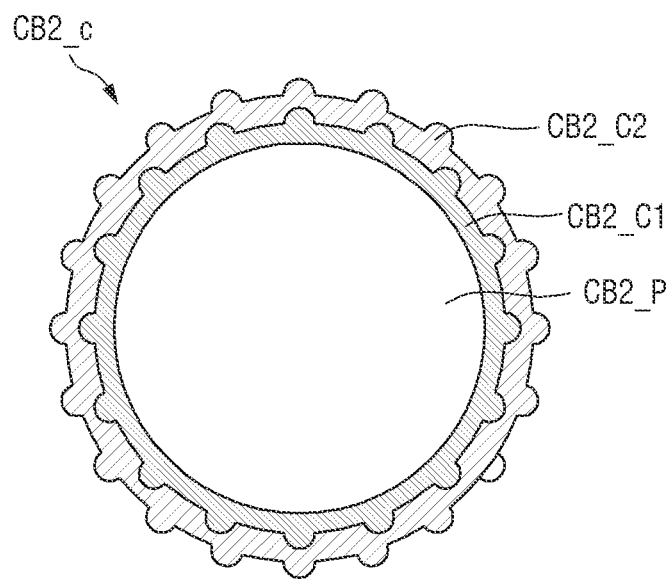

Referring to FIG. 12, in some embodiments, a second conductive ball CB2_c may include the polymer particle CB2_P, the first metal layer CB2_C1, and the second metal layer CB2_C2, wherein multiple protrusions or irregularities may be formed on an outer face of each of the first metal layer CB2_C1 and the second metal layer CB2_C2.

Figure 13:
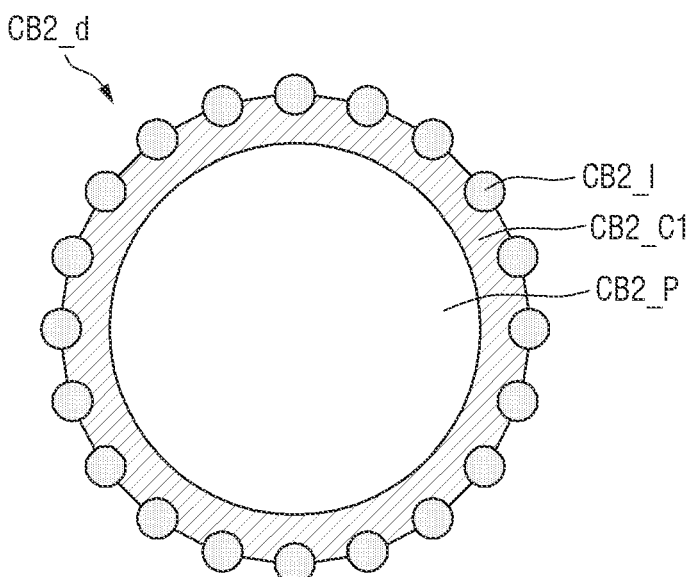

Referring to FIG. 13, in some embodiments, a second conductive ball CB2_d may include the polymer particle CB2_P, and the first metal layer CB2_C1, and may further include multiple insulating particles CB2_I distributed on and along an outer face of the first metal layer CB2_C1. The insulating particles CB2_I may be arranged to surround the outer face of the first metal layer CB2_C1 and constitute protrusions at and along an outer face of the second conductive ball CB2_d. Accordingly, the second conductive ball CB2_d may be stably seated on the pad electrode PAD (see FIG. 3), and at the same time, may prevent a short circuit that may occur in case that the second conductive ball CB2_d is in close contact with another second conductive ball CB2_d.

Figure 14:
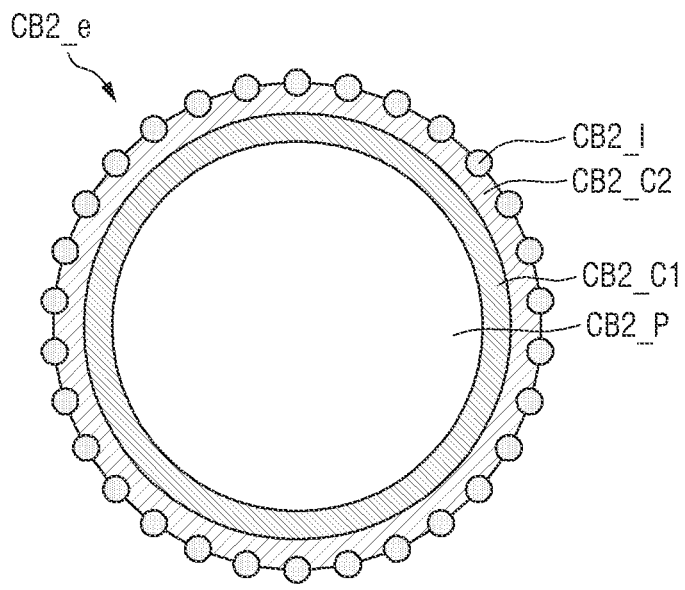

Referring to FIG. 14, in some embodiments, a second conductive ball CB2_e may further include the second metal layer CB2_C2, and the insulating particles CB2_I arranged at and along an outer face of the second metal layer CB2_C2 similarly to FIG. 13.

Figure 15:
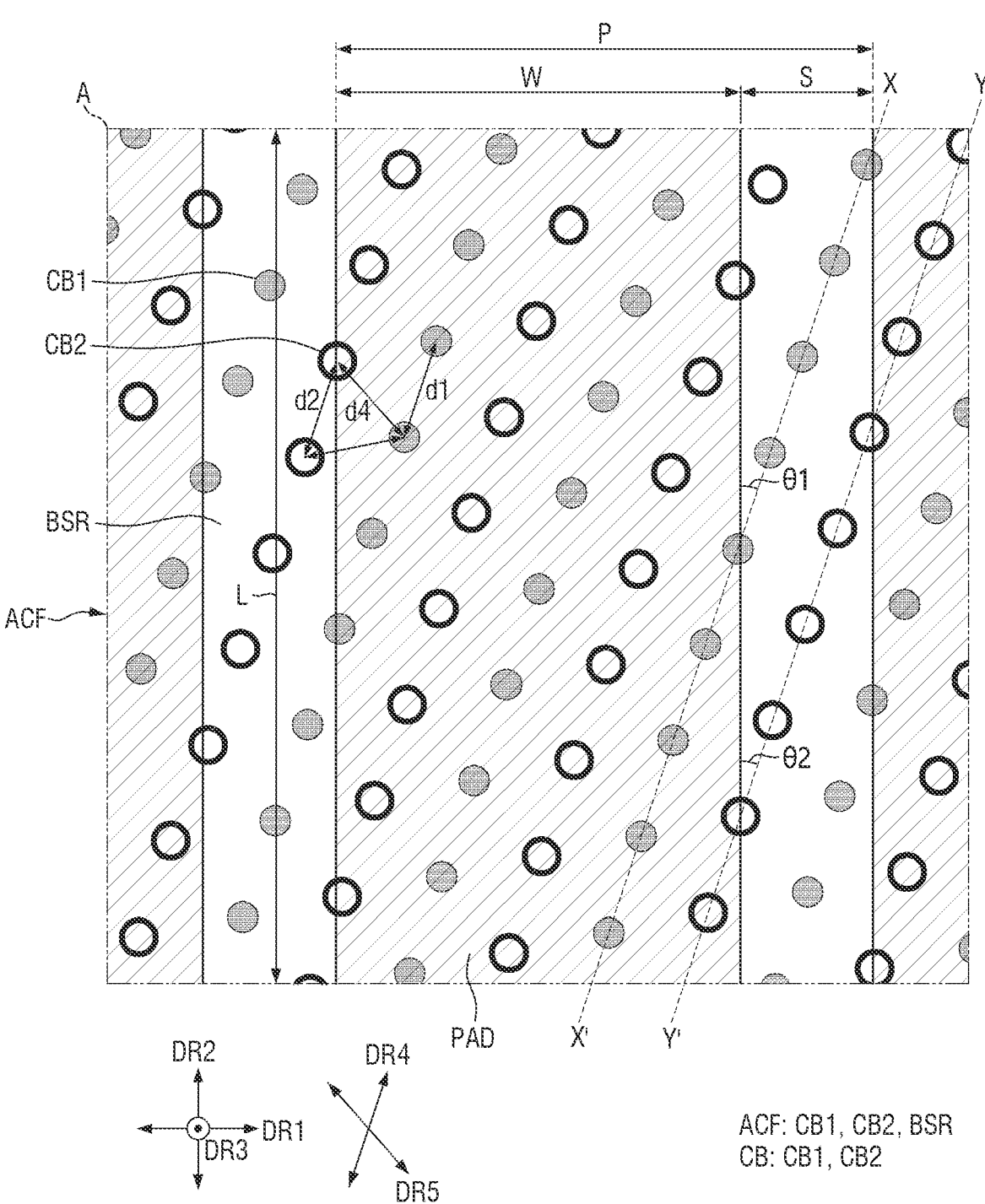
FIG. 15 is an enlarged schematic view of area A of FIG. 3 according to an embodiment.

FIG. 15 is an enlarged schematic view of area A of FIG. 3 according to an embodiment. FIG. 16 is a schematic cross-sectional view taken along a line of FIG. 5 according to an embodiment.

Referring to FIG. 15, the pad electrode PAD may include a short side W extending along the first direction DR1 as a horizontal direction and a long side L extending along the second direction DR2 as a vertical direction intersecting the first direction DR1.

The first conductive balls CB1 may be arranged in a line and spaced apart from each other in the fourth direction DR4 intersecting the first direction DR1 and the second direction DR2 to constitute the first group, while the second conductive balls CB2 may be arranged in a line and spaced apart from each other in the fourth direction DR4 intersecting the first direction DR1 and the second direction DR2 to constitute the second group.

The first groups including the first conductive balls CB1 and the second groups including the second conductive balls CB2 may be alternately arranged along the fifth direction DR5 intersecting the fourth direction DR4 and may extend in a parallel manner to each other. For example, the first conductive balls CB1 included in the first group and the second conductive balls CB2 included in the second group may be alternately arranged along the fifth direction DR5.

Specifically, in an embodiment, a spacing d1 between the first conductive balls CB1 arranged in a line along the fourth direction DR4 and adjacent to each other in the fourth direction DR4 and a spacing d2 between the second conductive balls CB2 arranged in a line along the fourth direction DR4 and adjacent to each other in the fourth direction DR4 may be equal to each other.

Further, each of spacings d3 and d4 between one first conductive ball CB1 included in the first group and two adjacent second conductive balls CB2 arranged in a line along the fourth direction DR4 and closest thereto may be equal to each of the spacing d1 between the first conductive balls CB1 arranged in a line along the fourth direction DR4 and adjacent to each other in the fourth direction and the spacing d2 between the second conductive balls CB2 arranged in a line along the fourth direction DR4 and adjacent to each other in the fourth direction.

For example, the spacing d3 between one first conductive ball CB1 included in the first group and one of two adjacent second conductive balls CB2 arranged in a line along the fourth direction DR4 and closest thereto may be equal to the spacing d4 between one first conductive ball CB1 included in the first group and the other of two adjacent second conductive balls CB2 arranged in a line along the fourth direction DR4 and closest thereto. At the same time, each of the spacings d3 and d4 between one first conductive ball CB1 included in the first group and two adjacent second conductive balls CB2 arranged in a line along the fourth direction DR4 and closest thereto may be equal to each of the spacing d1 between the first conductive balls CB1 arranged in a line along the fourth direction DR4 and adjacent to each other in the fourth direction and the spacing d2 between the second conductive balls CB2 arranged in a line along the fourth direction DR4 and adjacent to each other in the fourth direction.

However, the disclosure is not limited thereto. In some embodiments, at least two of the spacing d1 between the first conductive balls CB1, the spacing d2 between the second conductive balls CB2, the spacing d3 between one first conductive ball CB1 included in the first group and one of two adjacent second conductive balls CB2 arranged in a line along the fourth direction DR4 and closest thereto, and the spacing d4 between one first conductive ball CB1 included in the first group and the other of two adjacent second conductive balls CB2 arranged in a line along the fourth direction DR4 and closest thereto may be equal to or different from each other.

Accordingly, one first conductive ball CB1 included in the first group and the two adjacent second conductive balls CB2 arranged in a line along the fourth direction DR4 and closest thereto may be arranged in an equilateral triangle shape in a plan view.

However, the disclosure is not limited thereto. In some embodiments, two adjacent first conductive balls CB1 arranged in a line along the fourth direction DR4, and two adjacent second conductive balls CB2 arranged in a line along the fourth direction DR4 and closest thereto may be arranged in a square shape in a plan view. In other embodiments, two adjacent first conductive balls CB1 arranged in a line along the fourth direction DR4, and two adjacent second conductive balls CB2 arranged in a line along the fourth direction DR4 and closest thereto may be arranged in a different shape from the square shape in a plan view while the spacing d1 between the first conductive balls CB1, the spacing d2 between the second conductive balls CB2, the spacing d3 between one first conductive ball CB1 included in the first group and one of two adjacent second conductive balls CB2 arranged in a line along the fourth direction DR4 and closest thereto, and the spacing d4 between one first conductive ball CB1 included in the first group and the other of two adjacent second conductive balls CB2 arranged in a line along the fourth direction DR4 and closest thereto are equal to each other.

In case that, as described above, the spacing d1 between the first conductive balls CB1, the spacing d2 between the second conductive balls CB2, the spacing d3 between one first conductive ball CB1 included in the first group and one of two adjacent second conductive balls CB2 arranged in a line along the fourth direction DR4 and closest thereto, and the spacing d4 between one first conductive ball CB1 included in the first group and the other of two adjacent second conductive balls CB2 arranged in a line along the fourth direction DR4 and closest thereto are equal to each other, the first conductive balls CB1 and the second conductive balls CB2 are dispersed and arranged in the bonding resin layer BSR contained in the anisotropic conductive film ACF. Thus, in case that the first conductive balls CB1 and the second conductive balls CB2 are bonded to the lead electrodes LE (see FIG. 5) and the pad electrodes PAD, a short circuit occurring in case that the first conductive balls CB1 and the second conductive balls CB2 come into contact with each other may be prevented.

In an embodiment, the number of the first conductive balls CB1 included in each of the first groups may be equal to the number of the second conductive balls CB2 included in each of the second groups. Accordingly, a content percentage of the first conductive balls CB1 contained in the anisotropic conductive film ACF and a content percentage of the second conductive balls CB2 contained in the anisotropic conductive film ACF may be equal to each other.

However, the disclosure is not limited thereto, and in some embodiments, the number of the first conductive balls CB1 included in each of the first groups and the number of the second conductive balls CB2 included in each of the second groups may be different from each other. A detailed description of an embodiment in which the number of the first conductive balls CB1 and the number of the second conductive balls CB2, for example, the content percentages of the first conductive balls CB1 and the second conductive balls CB2 contained in the anisotropic conductive film ACF are different from each other will be made later with reference to FIG. 17 to FIG. 20.

Referring to FIG. 15, the pad electrodes PAD may be arranged and be spaced apart from each other by a pitch P in the first direction DR1 in a plan view. The pitch P may be a sum of a short side Win the first direction DR1 of the pad electrode PAD and a spacing S in the first direction DR1 between the adjacent pad electrodes PAD.

In an embodiment, the short side W of the pad electrode PAD may be greater than the spacing S in the first direction DR1 between the pad electrodes PAD. For example, the pitch P may have a fine size of about 50 μm or smaller. In another example, the pitch P may be about 18 μm or smaller. In still another example, a size of the short side W of the pad electrode PAD may be larger by about 0.7 to about 0.9 times than the spacing S in the first direction DR1 between the pad electrodes PAD. In still another example, a difference between the size of the short side W of the pad electrode PAD and the spacing S in the first direction DR1 between the pad electrodes PAD may be in a range of about 1.0 μm to about 3.0 μm.

In an embodiment, each of the spacing d1 between the first conductive balls CB1, the spacing d2 between the second conductive balls CB2, the spacing d3 between one first conductive ball CB1 included in the first group and one of two adjacent second conductive balls CB2 arranged in a line along the fourth direction DR4 and closest thereto, and the spacing d4 between one first conductive ball CB1 included in the first group and the other of two adjacent second conductive balls CB2 arranged in a line along the fourth direction DR4 and closest thereto may be smaller than the size of the short side W of the pad electrode PAD.

As shown in FIG. 15, any virtual line X-X' extending in the fourth direction DR4 and passing through centers of the first conductive balls CB1 included in the first group may refer to an arrangement axis X-X' of the first conductive balls CB1 arranged in a line along the fourth direction DR4. Any virtual line Y-Y' extending in the fourth direction DR4 and passing through centers of the second conductive balls CB2 included in the second group may refer to an arrangement axis Y-Y' of the second conductive balls CB2 arranged in a line along the fourth direction DR4.

In an embodiment, each of a first angle θ1 defined between the arrangement axis X-X' passing through centers of the first conductive balls CB1 included in the first group and the long side L of the pad electrode PAD and being in a range of 0 degree excusive to 90 degrees inclusive in a plan view, and a second angle θ2 defined between the arrangement axis Y-Y' passing through centers of the second conductive balls CB2 included in the second group and the long side L of the pad electrode PAD and being in a range of 0 degree excusive to 90 degrees inclusive in a plan view may satisfy a following Equation 1.

For example, the first angle θ1 may refer to an angle defined between the long side L of the pad electrode PAD and the arrangement axis X-X' of the first conductive balls CB1 in a plan view, and being in a range of 0 exclusive and 90 degrees inclusive, and may be obtained by measuring an angle from the arrangement axis X-X' of the first conductive balls CB1 to the long side L of the pad electrode PAD in an angular manner in a counterclockwise direction (in FIG. 15). The second angle θ2 may refer to an angle defined between the long side L of the pad electrode PAD and the arrangement axis Y-Y' of the second conductive balls CB2 in a plan view, and being in a range of 0 exclusive and 90 degrees inclusive, and may be obtained by measuring an angle from the arrangement axis Y-Y' of the second conductive balls CB2 to the long side L of the pad electrode PAD in an angular manner in the counterclockwise direction (in FIG. 15).

$$\theta \geq \sin^{-1}\left(\frac{P\ \cos\theta}{L}\right) \qquad \text{[Equation 1]}$$

$$(W > \text{each of } d1 \text{ and } d2),$$

where θ refers to each of the first and second angles,

W denotes a size of the short side of pad electrodes extending in the first direction, L denotes a size of the long side of the pad electrode extending in the second direction, P denotes the sum of the size of the short side of the pad electrode extending in the first direction and the spacing in the first direction between the adjacent pad electrodes, d1 denotes the spacing between the first conductive balls arranged in a line and closest to each other in a plan view, d2 denotes the spacing between the second conductive balls arranged in a line and closest to each other in a plan view.

In this way, the first conductive balls CB1 and the second conductive balls CB2 may be regularly arranged so that the first conductive balls CB1 and the second conductive balls CB2 may have a regular arrangement in the anisotropic conductive film ACF. Accordingly, in case that the anisotropic conductive film ACF is disposed between the lead electrodes LE and the pad electrodes PAD, and bonds to and is in contact with each of the lead electrodes LE and the pad electrodes PAD, the conductive balls CB contained in the anisotropic conductive film ACF may be subjected to uniform pressure and thus may be uniformly arranged, thereby preventing contact between adjacent conductive balls CB, and thus minimizing occurrence of the short circuit.

Referring to FIG. 16, in an embodiment, the pad electrodes PAD may be disposed on one face of the first substrate 101 facing the base film 510. For example, as described above, the pad electrodes PAD may be arranged to be spaced apart from each other by the pitch P in the first direction DR1 in a cross-sectional view.

Specifically, in a cross-sectional view, a first pad electrode PAD1 having a first width W1 in the first direction DR1 and a second pad electrode PAD2 having a second width W2 in the first direction DR1 may be arranged to be spaced apart from each other by a first spacing S1 in the first direction DR1, and may be arranged to be spaced apart from each other by a first pitch P1 in the first direction DR1.

Further, in a cross-sectional view, the second pad electrode PAD2 having the second width W2 in the first direction DR1 may be arranged to be spaced apart from a third pad electrode PAD3 by a second spacing S2 in the first direction
DR1, and the second pad electrode PAD2 and the third pad
electrode PAD3 may be arranged to be spaced apart from
each other by a second pitch P2 in the first direction DR1.

Referring to FIG. 16, the lead electrodes LE may be
disposed on a face of the base film 510 facing the first
substrate 101. The lead electrodes LE may be disposed to
face the pad electrodes PAD, respectively. The lead elec-
trodes LE may be disposed to overlap the pad electrodes
PAD in the thickness direction, respectively.

In an embodiment, the lead electrodes LE may be
arranged to be spaced apart from each other by the first pitch
P1 or the second pitch P2 by which the pad electrodes PAD
may be.

Specifically, a first lead electrode LE1 and a second lead
electrode LE2 may have the first width W1 and the second
width W2 in the first direction DR1, respectively which may
be equal to the first width W1 and the second width W2 of
the first pad electrode PAD1 and the second pad electrode
PAD2, respectively. The first spacing S1 in the first direction
DR1 between the first lead electrode LE1 and the second
lead electrode LE2 may be equal to the first spacing S1 in the
first direction DR1 between the first pad electrode PAD1 and
the second pad electrode PAD2. The second spacing S2 in
the first direction DR1 between the second lead electrode
LE2 and the third lead electrode LE3 may be equal to the
second spacing S2 in the first direction DR1 between the
second pad electrode PAD2 and the third pad electrode
PAD3. Therefore, the first lead electrode LE1 and the second
lead electrode LE2 may be spaced apart from each other by
the first pitch P1 in the first direction DR1. The second lead
electrode LE2 and the third lead electrode LE3 may be
spaced apart from each other by the second pitch P2 in the
first direction DR1.

However, the disclosure is not limited thereto, and in
some embodiments, the first lead electrode LE1 and the
second lead electrode LE2 may have the first width W1 and
the second width W2 in the first direction DR1 respectively
different from the first width W1 and the second width W2
in the first direction DR1 of the first pad electrode PAD1 and
the second pad electrode PAD2. The first spacing S1 in the
first direction DR1 between the first pad electrode PAD1 and
the second pad electrode PAD2 and the second spacing S2
in the first direction DR1 between the second pad electrode
PAD2 and the third pad electrode PAD3 may be respectively
different from the first spacing S1 in the first direction DR1
between the first lead electrode LE1 and the second lead
electrode LE2 and the second spacing S2 in the first direc-
tion DR1 between the second lead electrode LE2 and the
third lead electrode LE3.

Accordingly, in some embodiments, the first lead elec-
trode LE1, the second lead electrode LE2, and the third lead
electrode LE3 may be arranged such that the first spacing S1
in the first direction DR1 between the first pad electrode
PAD1 and the second pad electrode PAD2 and the second
spacing S2 in the first direction DR1 between the second pad
electrode PAD2 and the third pad electrode PAD3 may be
respectively different from the first spacing S1 in the first
direction DR1 between the first lead electrode LE1 and the
second lead electrode LE2 and the second spacing S2 in the
first direction DR1 between the second lead electrode LE2
and the third lead electrode LE3.

As shown in FIG. 16, the first conductive balls CB1 and
the second conductive balls CB2 contained in the anisotro-
pic conductive film ACF may be disposed in an area where
the lead electrodes LE and the pad electrodes PAD respec-
tively overlap each other in the thickness direction, such that the lead electrodes LE and the pad electrodes PAD may be
electrically connected to each other, respectively.

Referring to FIG. 16, the anisotropic conductive film ACF
may include a first area in which the anisotropic conductive
film ACF overlaps the lead electrodes LE and the pad
electrodes PAD in the thickness direction in a cross-sectional
view, and a second area in which the anisotropic conductive
film ACF may not overlap the lead electrodes LE and/or the
pad electrodes PAD in the thickness direction in a cross-
sectional view. In each of the first area and the second area,
the first conductive balls CB1 and the second conductive
balls CB2 may be alternately arranged with each other in the
first direction DR1 and may be arranged to constitute one
row.

In an embodiment, the number of the first conductive balls
CB1 included in the first area, the number of the second
conductive balls CB2 included in the first area, the number
of the first conductive balls CB1 included in the second area,
and the number of the second conductive balls CB2 included
in the second area may be equal to each other. However, the
disclosure is not limited thereto, and in some embodiments,
only at least two of the number of the first conductive balls
CB1 included in the first area, the number of the second
conductive balls CB2 included in the first area, the number
of the first conductive balls CB1 included in the second area,
and the number of the second conductive balls CB2 included
in the second area may be equal to each other.

For example, the number of the first conductive balls CB1
included in the first area and the number of the second
conductive balls CB2 included in the first area may be equal
to each other, while the number of the first conductive balls
CB1 included in the second area and the number of the
second conductive balls CB2 included in the second area
may be different from each other.

In another example, the number of the first conductive
balls CB1 included in the first area and the number of the
second conductive balls CB2 included in the first area may
be different from each other, while the number of the first
conductive balls CB1 included in the second area and the
number of the second conductive balls CB2 included in the
second area may be equal to each other.

The first conductive balls CB1 and the second conductive
balls CB2 disposed in the first area may contact the pad
electrodes PAD and the lead electrodes LE while overlap-
ping therewith in the thickness direction.

Specifically, the first conductive balls CB1 included in the
first area may contact the pad electrode PAD and the lead
electrode LE while overlapping therewith in the thickness
direction. The metal layer CB2_C1 of the second conductive
ball CB2 included in the first area may contact the pad
electrode PAD and the lead electrode LE while the second
conductive ball CB2 overlaps therewith in the thickness
direction.

The first conductive balls CB1 and the second conductive
balls CB2 included in the second area may not overlap the
pad electrode PAD and the lead electrode LE in the thickness
direction.

Referring to FIG. 16, in an embodiment, a cross-sectional
shape of each of the first conductive balls CB1 included in
the first area, a cross-sectional shape of each of the second
conductive balls CB2 included in the first area, a cross-
sectional shape of each of the first conductive balls CB1
included in the second area, and a cross-sectional shape of
each of the second conductive balls CB2 included in the
second area may be different from each other.

Specifically, referring to an enlarged inset shown in FIG.
16, in a cross sectional view of the first conductive ball CB1 included in the first area, a width in the first direction DR1 of the first conductive ball CB1 increases as the first conductive ball CB1 extends from a middle level of the first conductive ball CB1 in the third direction DR3.

For example, the width in the first direction DR1 of the first conductive ball CB1 increases as the first conductive ball CB1 extends from a middle level of the first conductive ball CB1 toward each of a face of the lead electrode LE and a face of the pad electrode PAD. The width in the first direction DR1 of the first conductive ball CB1 may be maximum at an interface with each of a face of the lead electrode LE and a face of the pad electrode PAD. However, the disclosure is not limited thereto, and in some embodiments, the first conductive ball CB1 disposed in the area in which the anisotropic conductive film ACF overlaps the pad electrodes PAD and the lead electrodes LE may have a rectangular shape in cross-sectional view. For example, as the first conductive ball CB1 extends from a middle level of the first conductive ball CB1 in the third direction DR3, the width in the first direction DR1 of the first conductive ball CB1 may be constant.

Further, the second conductive ball CB2 included in the first area may be compressed between the lead electrode LE and the pad electrode PAD in a cross-sectional view and thus may have an oval shape elongate in a left-right direction in a cross-sectional view. For example, the second conductive ball CB2 included in the first area may have an elliptical shape in which a diameter in the first direction DR1 thereof may be larger than a diameter in the second direction DR2 intersecting the first direction DR1 in a cross-sectional view.

Referring to the enlarged view shown in FIG. 16, a surface of the first conductive ball CB1 may be in contact with the first lead electrode LE1 and the first pad electrode PAD1. A first interface LC1 may be formed in an area in which the surface of the first conductive ball CB1 and a face of the lead electrode LE are in contact with each other, while a second interface PC1 may be formed in an area where the surface of the first conductive ball CB1 and a face of the pad electrode PAD contact each other.

Further, a third interface LC2 may be formed in an area where a surface of the metal layer CB2_C1 of the second conductive ball CB2 contacts a face of the lead electrode LE, while a fourth interface PC2 may be formed in an area where the surface of the metal layer CB2_C1 and a face of the pad electrode PAD contact each other.

As described above, the first conductive ball CB1 includes a meltable solder material, etc. Thus, chemical bonding may occur in each of the first interface LC1 and the second interface PC1 under a thermocompression process to be described later, such that the first conductive ball CB1 may contact the lead electrode LE and the pad electrode PAD, and a contact area therebetween may be increased.

Therefore, due to the chemical bonding, in the first interface LC1, a material included in the first lead electrode LE1 and a material included in the first conductive ball CB1 may be mixed with each other, while in the second interface PC1, a material included in the first conductive ball CB1 and a material included in the first pad electrode PAD1 may be mixed with each other.

Further, unlike the first conductive ball CB1, physical bonding may occur at a third interface LC2 and a fourth interface PC2 respectively between the lead electrode LE and the pad electrode PAD and the second conductive ball CB2 under a thermocompression process to be described later. Thus, a cross-sectional shape of the second conductive ball CB2 may be changed such that a contact area thereof with each of the lead electrode LE and the pad electrode PAD may be increased.

Accordingly, in the third interface LC2, the material included in the metal layer CB2_C1 included in the second conductive ball CB2 and the material included in the first lead electrode LE1 may not be mixed with each other, but only physical contact between the surface of the metal layer CB2_C1 and the surface of the first lead electrode LE1 may occur. In the fourth interface PC2, the material included in the metal layer CB2_C1 included in the second conductive ball CB2 and the material included in the first pad electrode PAD1 may not be mixed with each other, but only physical contact between the surface of the metal layer CB2_C1 and the surface of the first pad electrode PAD1 may occur.

Therefore, in an embodiment, the first interface LC1 and the second interface PC1 may include different materials. The third interface LC2 and the fourth interface PC2 may include the same material. Each of the first interface LC1 and the second interface PC1 may include a different material from that of each of the third interface LC2 and the fourth interface PC2. However, the disclosure is not limited thereto.

Referring to FIG. 16, the first conductive balls CB1 and the second conductive balls CB2 included in the second area may not be subjected to a vertical pressure from the lead electrode LE and/or the pad electrode PAD under the thermocompression bonding process to be described later. An original shape of each of the first conductive balls CB1 and the second conductive balls CB2 contained in the anisotropic conductive film ACF before being compressed may be maintained under the thermocompression bonding process.

Specifically, in an embodiment, the first conductive ball CB1 included in the second area may have a spherical cross-sectional shape of a structure of made of a meltable material. The second conductive balls CB2 included in the second area may have a spherical cross-sectional shape and include the polymer particle CB2_P made of a polymer material and at least one metal layer CB2_C1 surrounding the polymer particle CB2_P. However, the disclosure is not limited thereto.

In this way, the first conductive balls CB1 included in the first area may be made of a low-melting material. Thus, in the first interface LC1 where the surface of the first conductive ball CB1 and the lead electrode LE contact each other, and the second interface PC1 where the surface of the first conductive ball CB1 and the pad electrode PAD contacts each other, melting may occur at the surface of the first conductive ball CB1 under the thermocompression bonding process to be described later, such that a larger contact area therebetween may be secured such that contact resistance therebetween may be lowered. The second conductive ball CB2 included in the first area has a structure in which the metal layer CB2_C1 may be coated on a surface of the polymer particle CB2_P. Thus, in case that the second conductive ball CB2 included in the first area is subjected to the vertical pressure from the lead electrode LE and the pad electrode PAD during the thermocompression bonding process to be described later, the cross-sectional shape thereof changes from the spherical shape to the oval shape in a cross-sectional view, such that the contact area thereof with each of a face of the lead electrode LE and a face of the pad electrode PAD increase. Thus, the contact resistance therebetween may be lowered.

Referring to FIG. 16, the bonding resin layer BSR contained in the anisotropic conductive film ACF may surround the conductive balls CB contained in the anisotropic conductive film ACF and may be disposed between the base film 510 and the first substrate 101.

The bonding resin layer BSR may be cured under the thermocompression bonding process to be described later. Thus, the cured bonding resin layer BSR located in the second area may surround the first conductive balls CB1 and the second conductive balls CB2 and at the same time, may restrict movement of the first conductive balls CB1 and the second conductive balls CB2. Thus, the first conductive balls CB1 and the second conductive balls CB2 located in the second area may be arranged substantially in the same line with the first conductive balls CB1 and the second conductive balls CB2 included in the first area, such that the first conductive balls CB1 and the second conductive balls CB2 in the first and second areas may constitute a row.

However, the disclosure is not limited thereto, and in some embodiments, the first conductive balls CB1 and the second conductive balls CB2 included in the second area may not be horizontally aligned with the first conductive balls CB1 and the second conductive balls CB2 included in the first area and may be positioned above or below a vertical level corresponding to the first conductive ball CB1s and the second conductive ball CB2 included in the first area.

As shown in FIG. 16, the bonding resin layer BSR located in the second area may not receive the pressure in the vertical direction from the lead electrode LE and/or the pad electrode PAD under the thermocompression bonding process, so that a thickness in the third direction DR3 of the bonding resin layer BSR located in the second area may be larger than a thickness in the third direction DR3 of the bonding resin layer BSR located in the first area.

Therefore, a vertical level of a top face of the bonding resin layer BSR located in the second area may be higher than that of a face of the lead electrode LE opposite to a face of the pad electrode PAD. The top face thereof may be in contact with a portion of a sidewall of the lead electrode LE.

The filling member FSR may be disposed to fill a space formed between the base film 510 and the lead electrodes LE. The filling member FSR may be made of an insulating material.

The filling member FSR may be made of the same type as or a different type of a resin as or from that of the bonding resin layer BSR. For example, the bonding resin layer BSR and the filling member FSR may be made of the same type of an acrylic resin.

In another example, the bonding resin layer BSR may be made of an acrylic resin, while the filling member FSR may be made of an epoxy resin. In still another example, both the bonding resin layer BSR and the filling member FSR may be made of a thermally-curable resin. In still another example, the bonding resin layer BSR may be made of a thermally-curable resin, while the filling member FSR may be made of an ultraviolet-curable resin.

In still another example, each of the bonding resin layer BSR and the filling member FSR may include at least one of an ultraviolet-curable resin and a thermally-curable resin. In still another example, the bonding resin layer BSR and the filling member FSR may be made of resins having different viscosities, respectively.

As the filling member FSR may be disposed to fill the space formed between the base film 510 and the lead electrodes LE, adhesion between the base film 510 and the first substrate 101 may be improved, so that the reliability of the display device 1 (see FIG. 1) according to an embodiment may be improved Hereinafter, other embodiments will be described in conjunction with FIG. 17 to FIG. 20. In following embodiments, the description of the same components as those of the already described embodiments will be omitted or simplified, and the description will be focused on differences therebetween.

Figure 17:
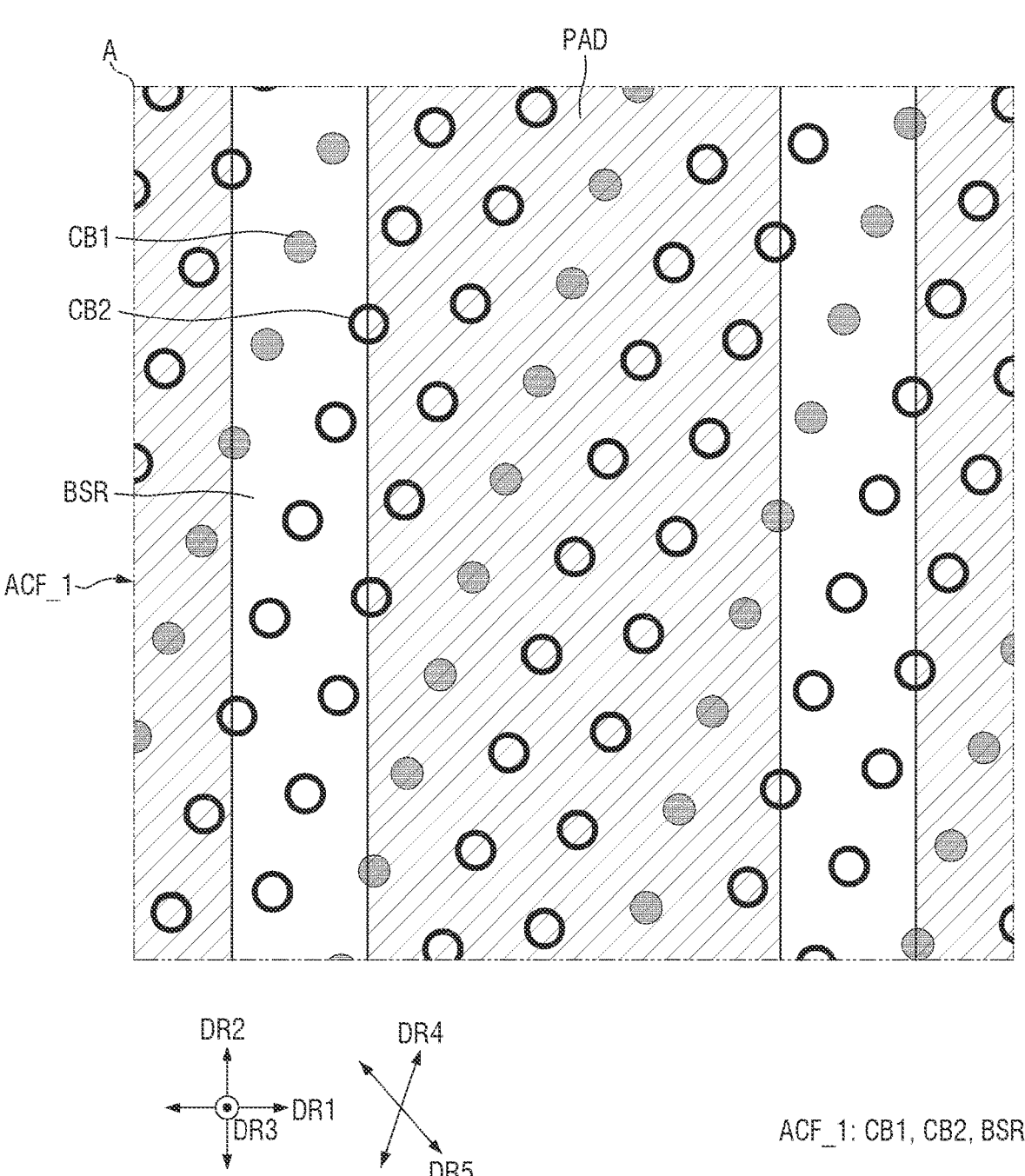
FIG. 17 is an enlarged schematic view of area A of FIG. 3 according to another embodiment.
Figure 18:
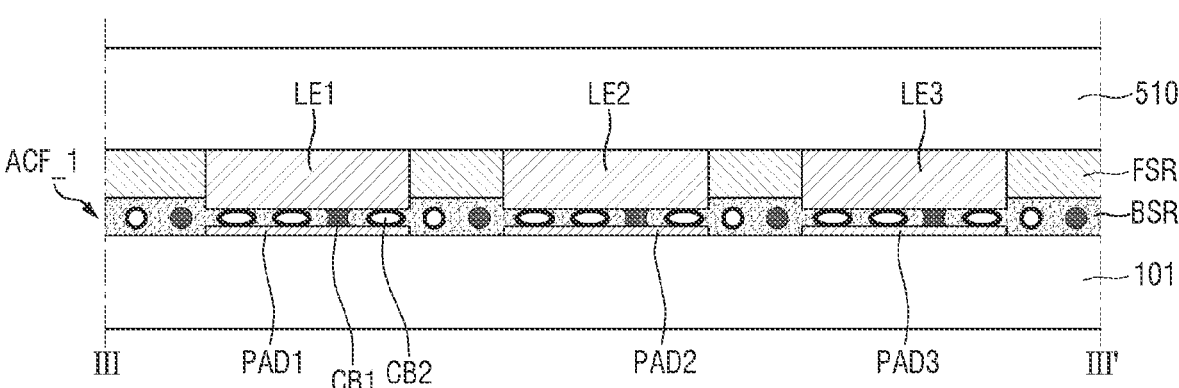
FIG. 18 is a schematic cross-sectional view taken along a line of FIG. 5 according to another embodiment.
Figure 18:
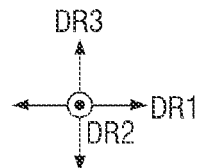

FIG. 17 is an enlarged schematic view of area A of FIG. 3 according to another embodiment. FIG. 18 is a schematic cross-sectional view taken along a line of FIG. 5 according to another embodiment.

Referring to FIG. 17, the anisotropic conductive film ACF_1 according to another embodiment may be different from that in an embodiment according to FIG. 15 at least in that the number of the first conductive balls CB1 and the number of the second conductive balls CB2 contained in the anisotropic conductive film ACF_1 may be different from each other, for example, the content percentage of the first conductive balls CB1 contained in the anisotropic conductive film ACF_1 and the content percentage of the second conductive ball CB2 contained in the anisotropic conductive film ACF_1 may be different from each other.

Specifically, the number of the first conductive balls CB1 contained in the anisotropic conductive film ACF_1 according to another embodiment may be smaller than the number of the second conductive balls CB2 contained in the anisotropic conductive film ACF_1 according to another embodiment. For example, a ratio between the content percentage of the first conductive balls CB1 and the content percentage of the second conductive balls CB2 may be 3:7. However, the ratio between the content percentage of the first conductive balls CB1 and the content percentage of the second conductive balls CB2 is not limited thereto.

As shown in FIG. 17, the first group including multiple first conductive balls CB1 spaced apart from each other and arranged in a line along the fourth direction DR4 and the second group including multiple second conductive balls CB2 spaced apart from each other and arranged in a line along the fourth direction DR4 may be arranged along the fifth direction DR5 and extend in a parallel manner to each other.

However, another embodiment as shown in FIG. 17 may be different from an embodiment according to FIG. 15 in which each of the first groups and each of the second groups are alternately arranged along the fifth direction DR5 at least in that in another embodiment according to FIG. 17, one first group and a pair of two second groups arranged consecutively are alternately arranged along the fifth direction DR5 and extend in a parallel manner to each other.

In other words, the anisotropic conductive film ACF_1 according to an embodiment according to FIG. 17 further includes a third group including multiple second conductive balls CB2 spaced apart from each other and arranged in a line along the fourth direction DR4, wherein the third group may be disposed between the first group and the second group and the first to third groups extend in a parallel manner to each other.

Referring to FIG. 18, the anisotropic conductive film ACF_1 may be different from that in an embodiment according to FIG. 16 at least in that the number of the first conductive balls CB1 included in the first area in which the anisotropic conductive film ACF_1 overlaps the lead electrodes LE and the pad electrodes PAD in the thickness direction may be smaller than the number of the second conductive balls CB2 included in the first area.

In FIG. 18, it is shown that, in a cross-sectional view, the number of the first conductive balls CB1 and the number of the second conductive balls CB2 included in the second area where the anisotropic conductive film ACF_1 may not overlap, in the thickness direction, with the lead electrodes LE and/or the pad electrodes PAD are equal to each other. However, the disclosure is not limited thereto, and in some embodiments, in the cross-sectional view, the number of the first conductive balls CB1 included in the second area and the number of the second conductive balls CB2 included in the second area may be different from each other.

Therefore, the anisotropic conductive film ACF_1 according to this embodiment includes the larger number of the second conductive balls CB2 having a higher restoring force than that of the first conductive ball CB1 than the number of the first conductive balls CB1. Thus, the short circuit between the lead electrode LE and the pad electrode PAD may be more effectively prevented even in case that the bonding resin layer BSR expands due to moisture permeation into the bonding resin layer BSR surrounding the first conductive balls CB1 and the second conductive balls CB2.

Figure 19:
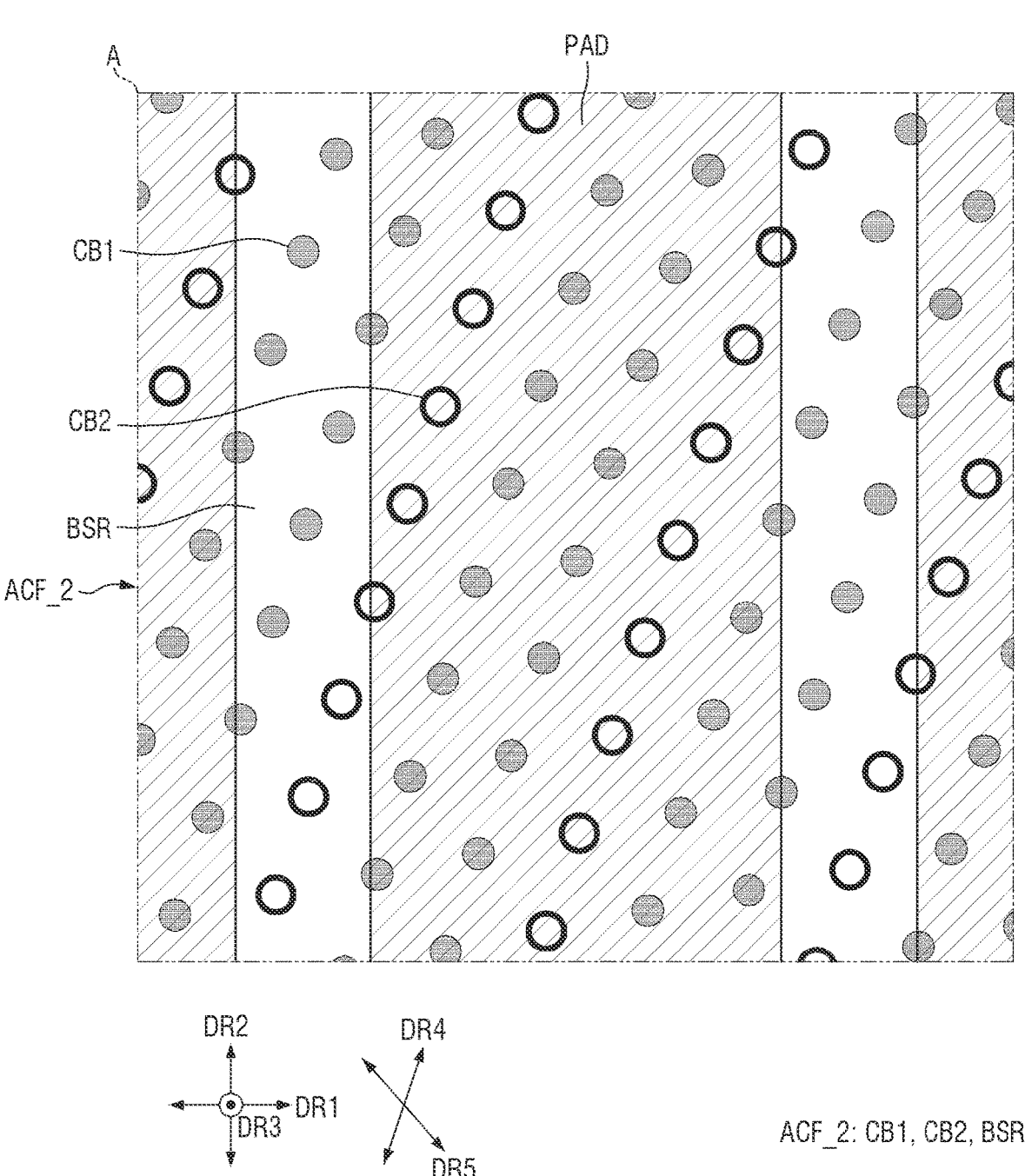
FIG. 19 is an enlarged schematic view of area A of FIG. 3 according to still another embodiment.
Figure 20:
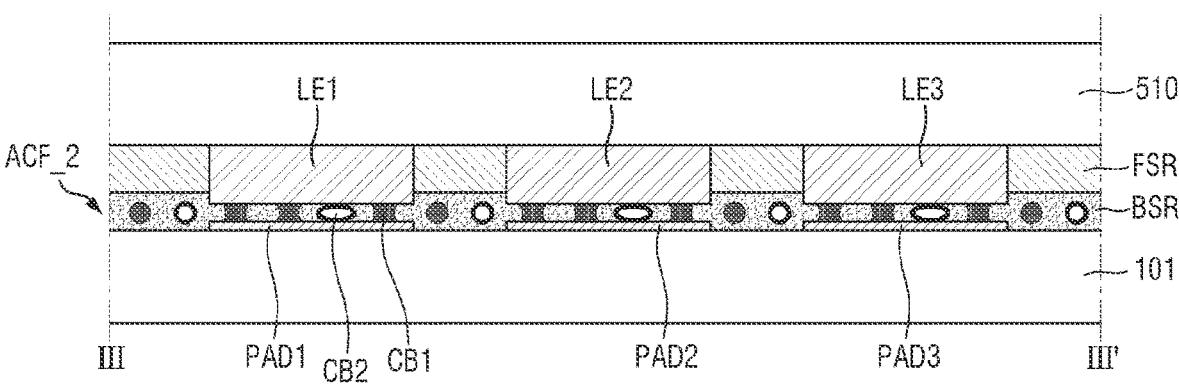
FIG. 20 is a schematic cross-sectional view taken along a line of FIG. 5 according to still another embodiment.
Figure 20:
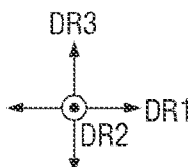

FIG. 19 is an enlarged schematic view of area A of FIG. 3 according to still another embodiment. FIG. 20 is a schematic cross-sectional view taken along a line of FIG. 5 according to still another embodiment.

Referring to FIG. 19, this embodiment may be different from an embodiment according to FIG. 17 at least in that, according to this embodiment, the number of the first conductive balls CB1 contained in the anisotropic conductive film ACF_2 may be greater than the number of the second conductive balls CB2 included therein. For example, a ratio between a content percentage of the first conductive balls CB1 and a content percentage of the second conductive ball CB2 may be 7:3. However, a ratio between the content percentage of the first conductive balls CB1 and the content percentage of the second conductive balls CB2 is not limited thereto.

Referring to FIG. 19, this embodiment may be different from an embodiment according to FIG. 17 at least in that in this embodiment, two first groups, each including the first conductive balls CB1 spaced apart from each other and arranged along the fourth direction DR4 are consecutively arranged along the fifth direction DR5, and the two first groups consecutively arranged along the fifth direction DR5 and the second group including the second conductive balls CB2 spaced apart from each other and arranged along the fourth direction DR4 are alternately arranged along the fifth direction DR5 and extend in a parallel manner to each other.

In other words, the anisotropic conductive film ACF_2 according to this embodiment further includes a fourth group including multiple first conductive balls CB1 spaced apart from each other and arranged in a line along the fourth direction DR4, wherein the fourth group may be disposed between the first group and the second group, and the first, second and forth groups extend in a parallel manner to each other.

Referring to FIG. 20, this embodiment may be different from an embodiment according to FIG. 18 at least in that, in this embodiment, the number of the first conductive balls CB1 included in the first area in which the anisotropic conductive film ACF_2 overlaps the lead electrodes LE and the pad electrodes PAD in the thickness direction may be larger than the number of the second conductive balls CB2 included in the first area.

In FIG. 20, it is shown that, in a cross-sectional view, the number of the first conductive balls CB1 and the number of the second conductive balls CB2 included in the second area where the anisotropic conductive film ACF_1 may not overlap, in the thickness direction, with the lead electrodes LE and/or the pad electrodes PAD are equal to each other.

However, the disclosure is not limited thereto, and in some embodiments, in the cross-sectional view, the number of the first conductive balls CB1 included in the second area and the number of the second conductive balls CB2 included in the second area may be different from each other.

Therefore, in the anisotropic conductive film ACF_2 according to this embodiment, the number of the first conductive balls CB1, each having a relatively large contact area with each of a face of the lead electrode LE and a face of the pad electrode PAD than a contact area of the second conductive ball CB2 therewith, may be larger than the number of the second conductive ball CB2, thereby effectively lowering electrical resistance between the anisotropic conductive film and each of the lead electrode LE and the pad electrode PAD.

Hereinafter, a method for manufacturing a display device according to an embodiment will be described in detail.

Figure 21:
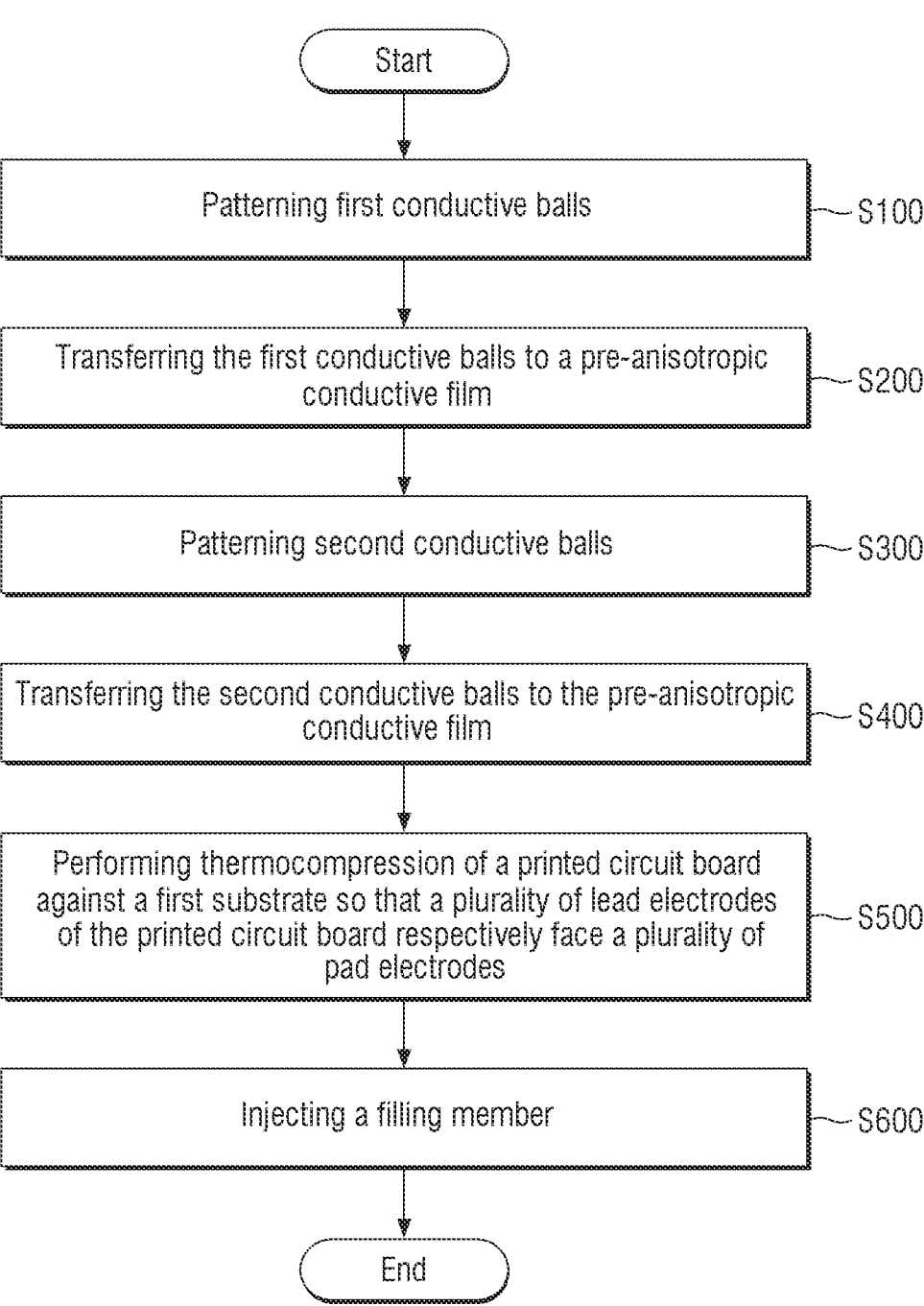
FIG. 21 is a flowchart showing a method for manufacturing a display device according to an embodiment.

FIG. 21 is a flowchart showing a method for manufacturing a display device according to an embodiment. FIG. 22 to FIG. 29 are schematic diagrams for illustrating a method for manufacturing a display device according to an embodiment.

Referring to FIG. 21, the method for manufacturing the display device may include a step S100 of patterning the first conductive balls, a step S200 of transferring the first conductive balls to a pre-anisotropic conductive film, a step S300 of patterning the second conductive balls, a step S400 of transferring the second conductive balls to the pre-anisotropic conductive film, a step S500 of performing thermocompression of the printed circuit board against the first substrate so that the lead electrodes of the printed circuit board respectively face the pad electrodes, and a step S600 of injecting the filling member.

The method for manufacturing the display device is not limited to the above example. When the method is described below with referring to FIG. 22 to FIG. 29, at least some of the steps may be omitted or at least one further step may be further added thereto.

Figure 22:
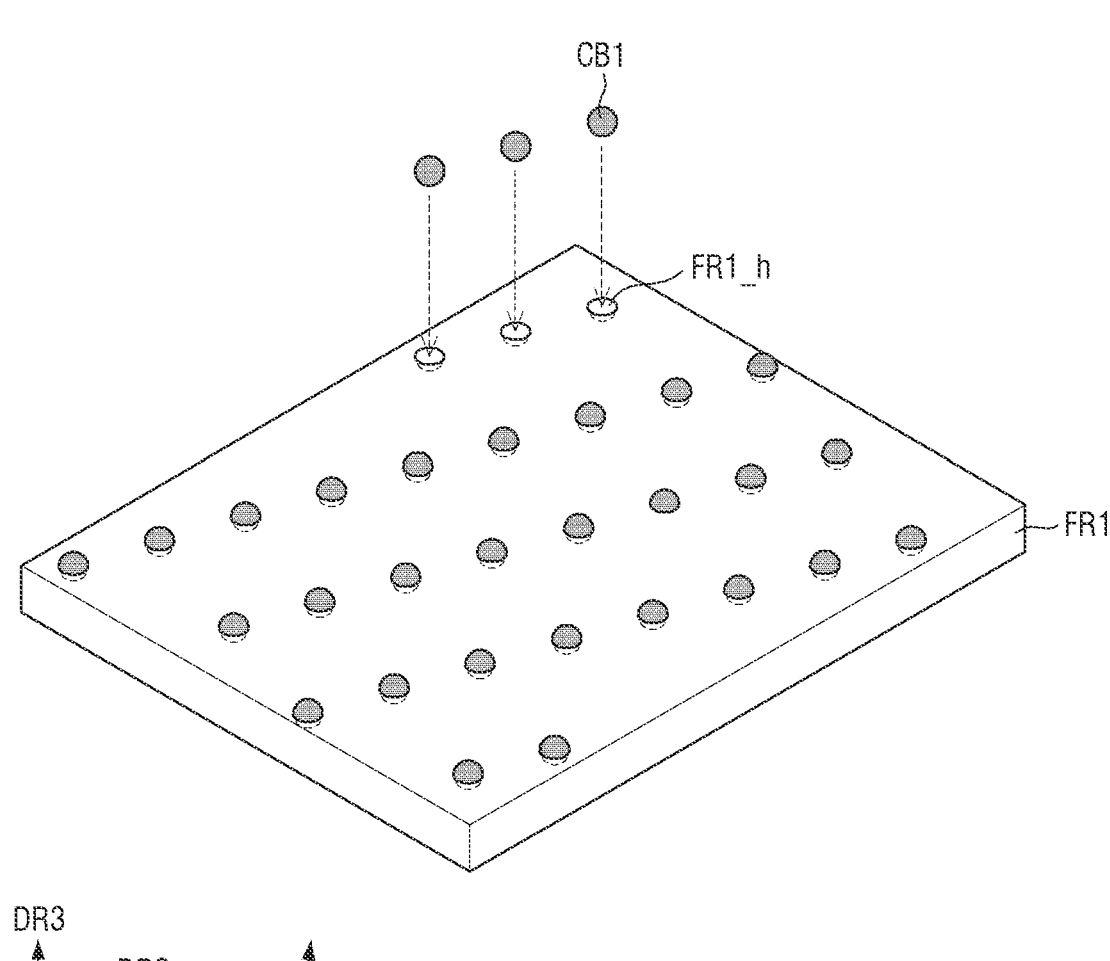
FIG. 22 to FIG. 29 are schematic diagrams for illustrating a method for manufacturing a display device according to an embodiment.
Figure 22:
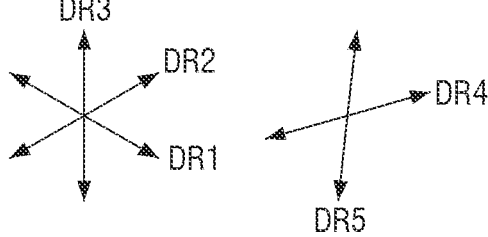

Referring to FIG. 22, the step S100 of patterning the first conductive balls may further include a step of preparing a first frame FR1 having multiple first conductive ball receiving holes FR1_h defined therein in which the first conductive balls CB1 are accommodated respectively.

Specifically, the first conductive ball receiving holes FR1_h of the first frame FR1 may have the same arrangement as the arrangement of the first conductive balls CB1 shown in FIG. 15. The first conductive ball receiving hole FR1_h may have a hemispherical shape to accommodate the first conductive ball CB1 therein. However, the disclosure is not limited thereto. The shape of the receiving hole is not limited particularly as long as the first conductive ball CB1 may be accommodated therein.

Subsequently, the first conductive balls CB1 may be ejected onto a surface of the first frame FR1 so that the first conductive balls CB1 are respectively accommodated in the first conductive ball receiving holes FR1_h. A scheme of ejecting the first conductive balls CB1 on the surface of the first frame FR1 is not limited particularly. For example, the first conductive balls CB1 may be ejected onto the surface of the first frame FR1 via a jetting nozzle of a jetting device.

Some of the first conductive balls CB1 ejected onto the first frame FR1 may be accommodated in the first conductive ball receiving holes FR1_h. Thus, others of the first conductive balls CB1 not received in the first conductive ball receiving holes FR1_h and remaining on the first frame FR1 may be removed.

Figure 23:
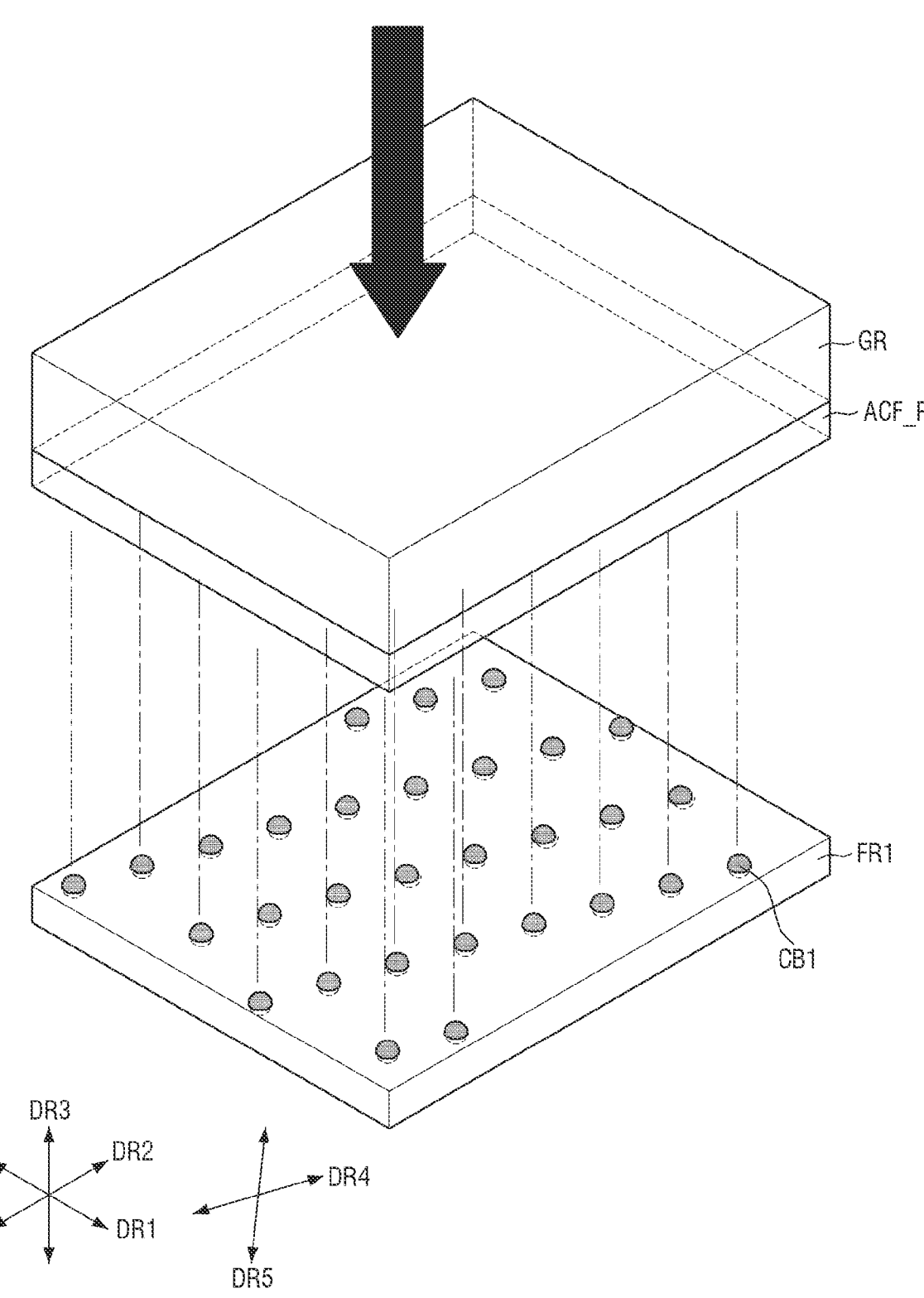
Figure 24:
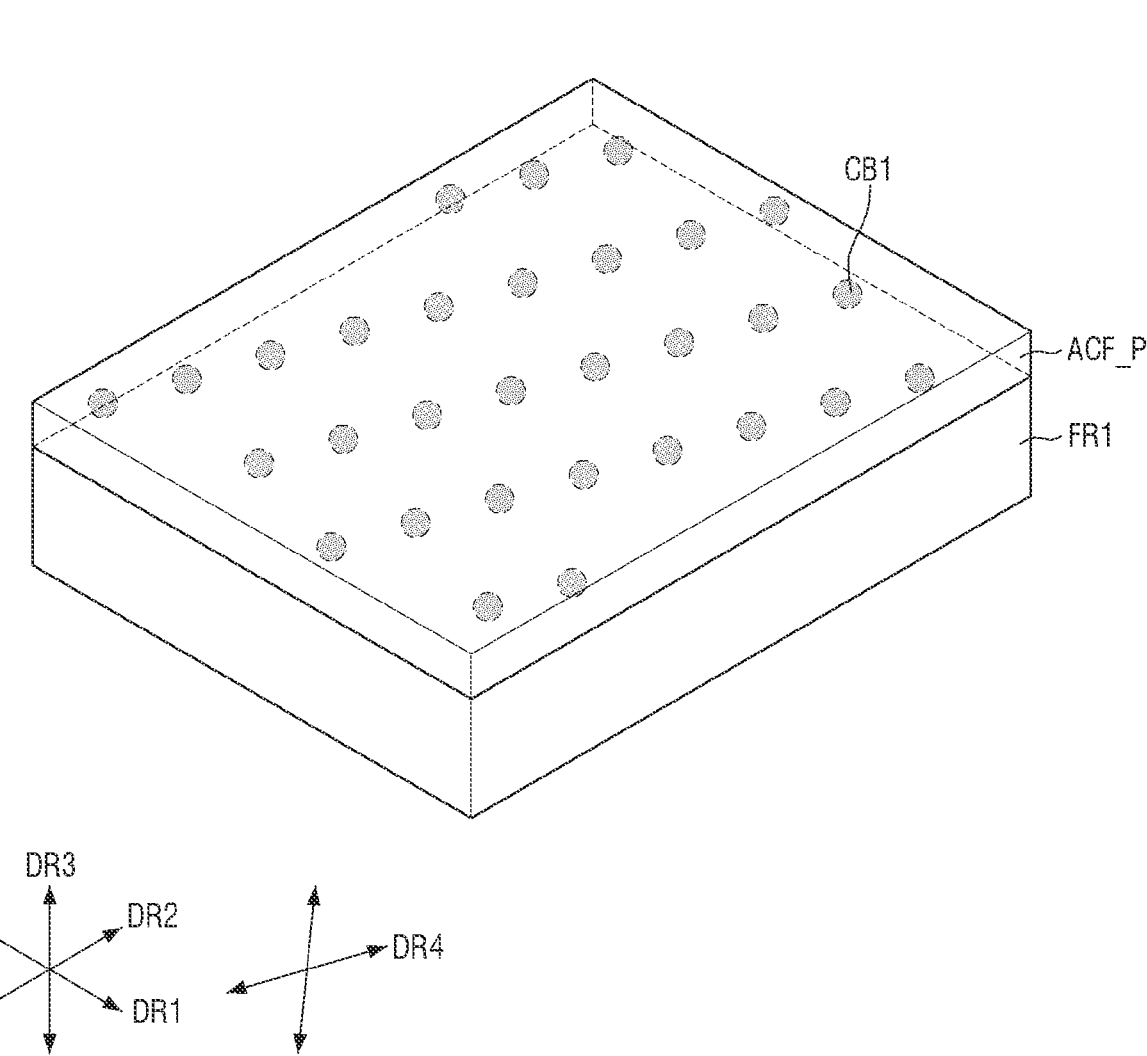

Referring to FIG. 23 and FIG. 24, in the step S200 of transferring the first conductive balls to the pre-anisotropic conductive film, the pre-anisotropic conductive film ACF_P may be laminated on a stretchable guide member GR, and the pre-anisotropic conductive film ACF_P may be placed on a top face of the first frame FR1 so as to face the first conductive balls CB1 respectively received in the first conductive ball receiving holes FR1_h.

The pre-anisotropic conductive film ACF_P may include an insulating material with adhesive strength. For example, the pre-anisotropic conductive film ACF_P may include a thermoplastic resin such as styrene butadiene resin or polyvinyl butylene resin, or a thermosetting resin such as an epoxy resin, polyurethane resin, and/or acrylic resin.

Further, the pre-anisotropic conductive film ACF_P may be made of an ultraviolet curable resin such as epoxy acrylate, urethane acrylate, unsaturated polyester resin, polyester acrylate, polyether acrylate or unsaturated acrylic resin. However, the disclosure is not limited thereto. The pre-anisotropic conductive film ACF_P may have a viscosity of about 500 cps to about 1000 cps at about 25° C. before curing. However, the disclosure is not limited thereto.

The guide member GR may be made of a material having stretchability. For example, the guide member GR may be made of a material such as PET (Polyethylene Terephthalate), OPP (oriented polypropylene), PMP (poly-4-methylpentene-1), and/or PTFE (polytetrafluoroethylene). However, the disclosure is not limited thereto.

The pre-anisotropic conductive film ACF_P facing the first frame FR1 may be displaced in the vertical direction such that the first conductive balls CB1 and the pre-anisotropic conductive film ACF_P contact each other. The method may pressurize the first frame FR1 against the pre-anisotropic conductive film ACF_P such that the first conductive balls CB1 disposed on the surface of the first frame FR1 may be transferred to the pre-anisotropic conductive film ACF_P.

Figure 25:
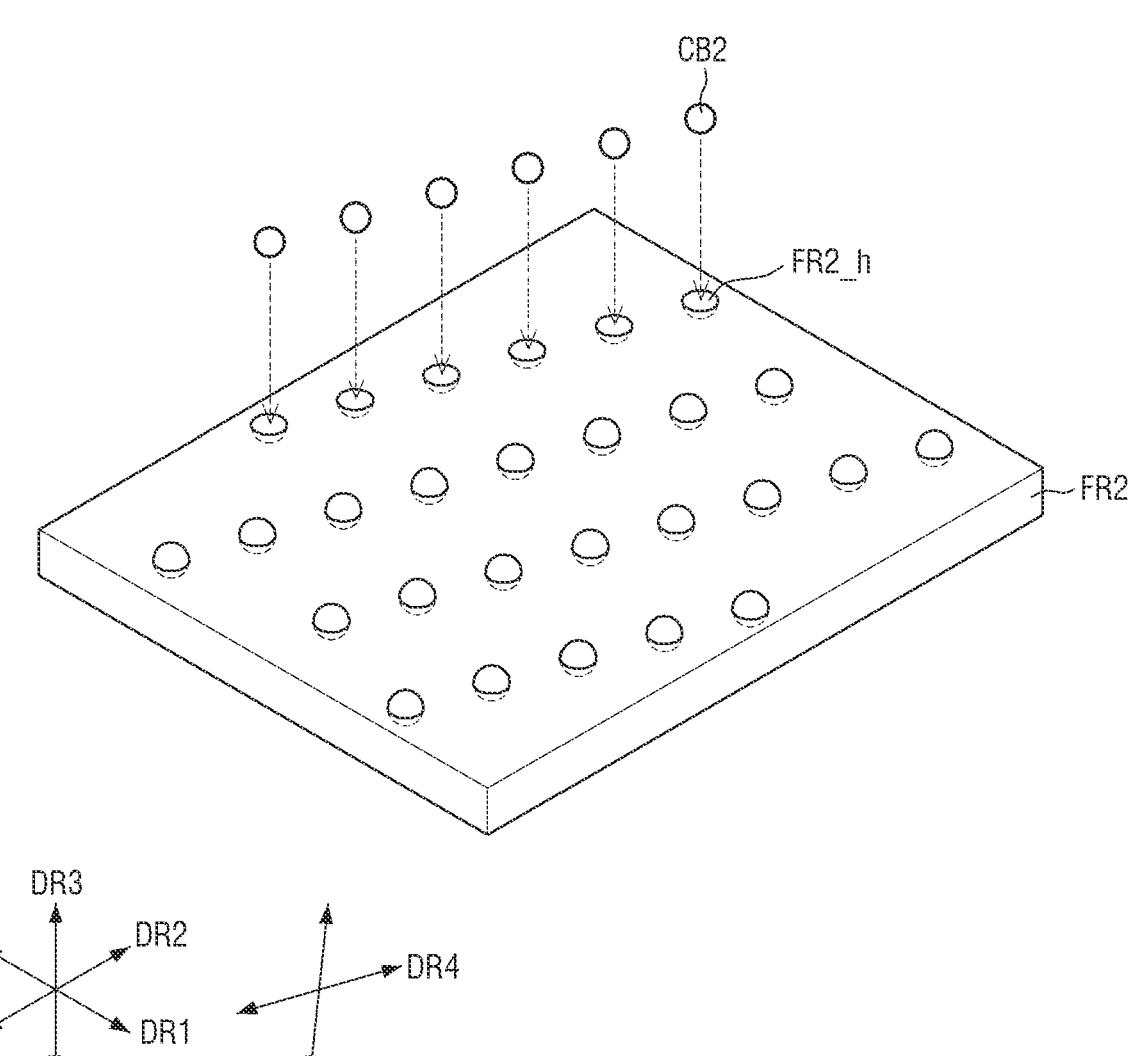
Figure 26:
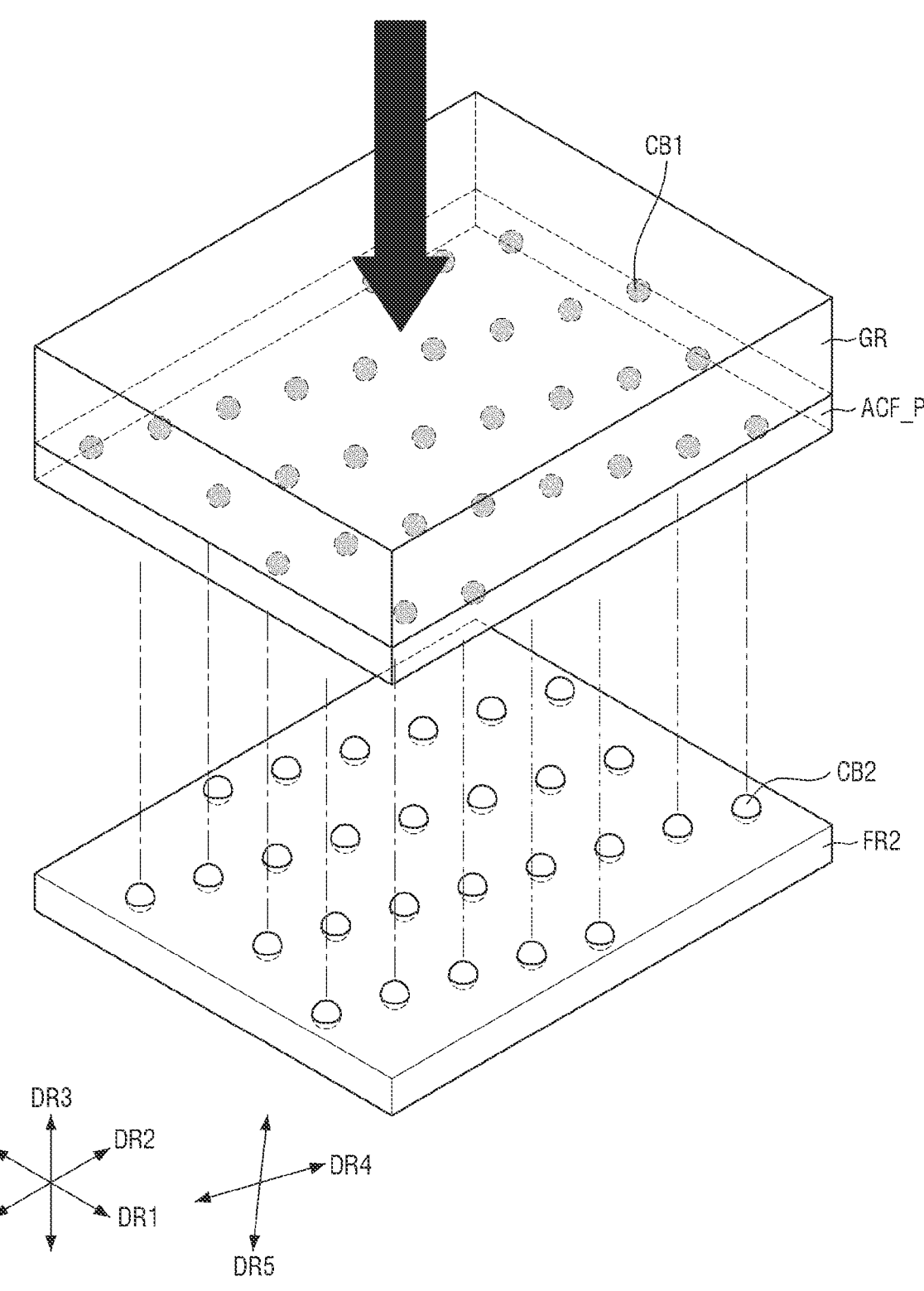

Referring to FIG. 25 and FIG. 26, the step S300 of patterning the second conductive balls and the step S400 of transferring the second conductive balls to the pre-anisotropic conductive film will be described. In this regard, the step S300 of patterning the second conductive balls may be substantially the same as the step S100 of patterning the first conductive balls as described above with reference to FIG. 22. Thus, the following description will be focused on differences therebetween.

Referring to FIG. 25, the step S300 of patterning the second conductive balls may include a step of preparing a second frame FR2 having multiple second conductive ball receiving holes FR2_h defined therein in which multiple second conductive balls CB2 may be accommodated, respectively.

Specifically, the second conductive ball receiving holes FR2_h of the second frame FR2 may have the same arrangement as the arrangement of the second conductive balls CB2 as shown in FIG. 15.

Therefore, the step S300 of patterning the second conductive balls may be performed in substantially the same manner as that in the step S100 of patterning the first conductive ball as described above in conjunction with FIG. 22 except that the second frame FR2 including the second conductive ball receiving holes FR2_h having the arrangement different from that of the first conductive ball receiving holes FR1_h included in the first frame FR1 may be used.

Figure 27:
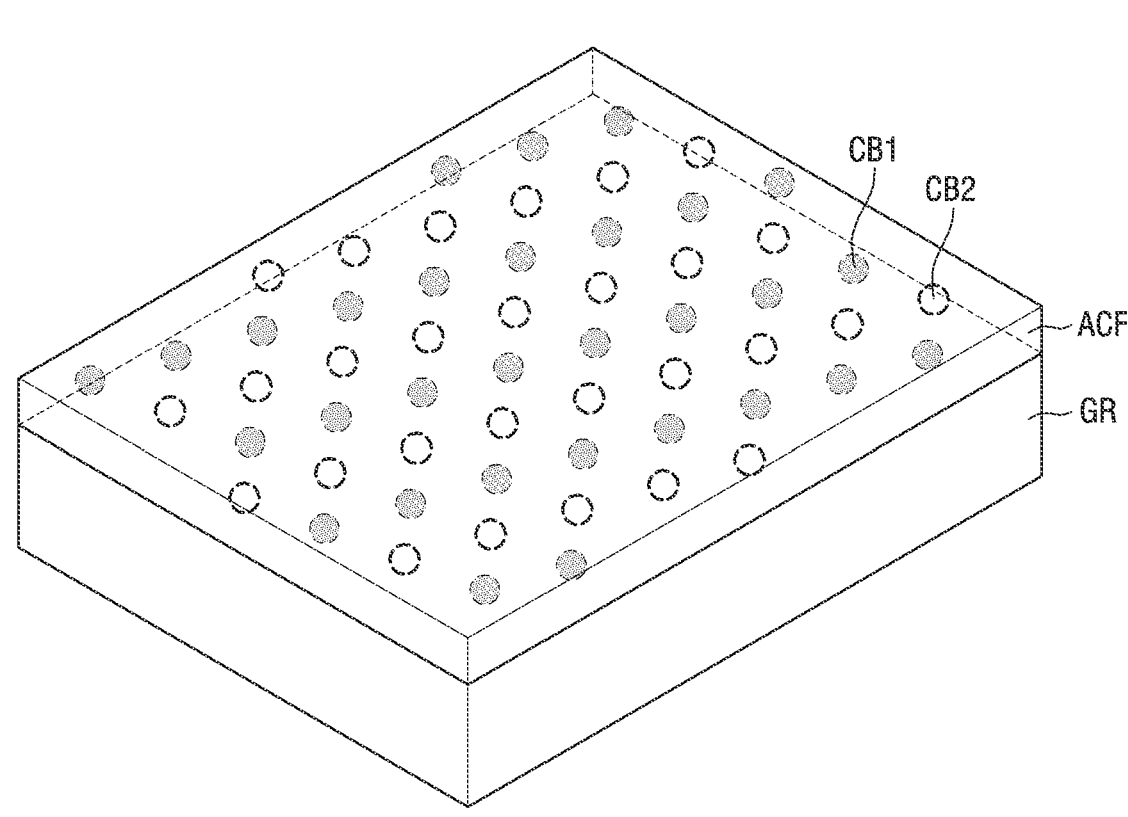
Figure 27:
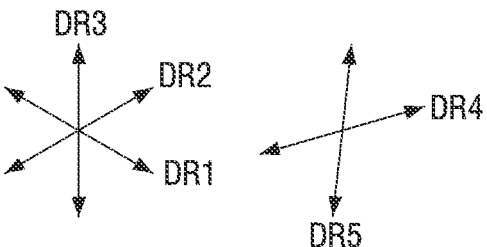

Referring to FIG. 26, in the step S400 of transferring the second conductive balls to the pre-anisotropic conductive film, the pre-anisotropic conductive film ACF_P having the first conductive balls CB1 transferred thereto via the step S200 of transferring the first conductive balls as described above through FIG. 23 and FIG. 24 may be brought into contact with the second frame FR2 including the second conductive balls CB2 received in the second conductive ball accommodating holes FR2_h. The second frame may be pressed against the pre-anisotropic conductive film such that the second conductive balls CB2 accommodated in the second conductive ball receiving holes FR2_h are transferred to the pre-anisotropic conductive film ACF_P including the first conductive balls CB1. Thus, as shown in FIG. 27, the anisotropic conductive film ACF including the first conductive balls CB1 and the second conductive balls CB2 may be manufactured.

Figure 28:
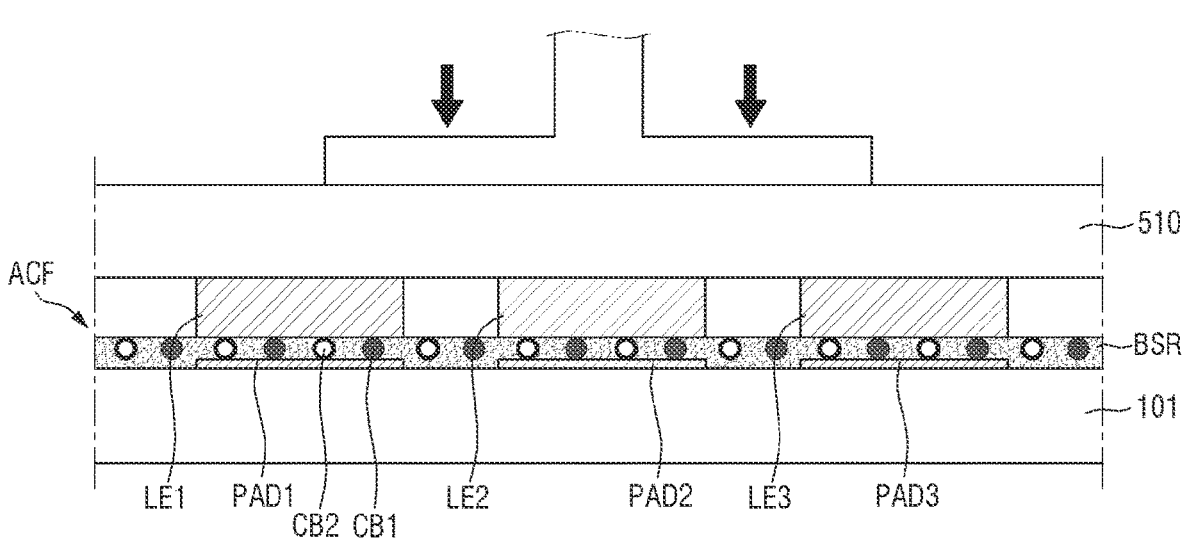
Figure 28:
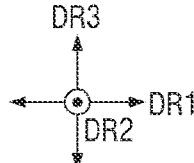

Referring to FIG. 28, the step S500 of performing thermocompression bonding of the printed circuit board to the first substrate so that the lead electrodes of the printed circuit board respectively face the pad electrodes may further include a step of placing the anisotropic conductive film between a lead portion and a pad portion.

In the step of disposing the anisotropic conductive film between the lead portion and the pad portion, the guide member GR disposed on a face of the anisotropic conductive film ACF including the first conductive balls CB1 and the second conductive balls CB2 may be removed (see FIG. 27), and, the anisotropic conductive film ACF may be placed between the lead electrodes LE and the pad electrodes PAD such that a face of the anisotropic conductive film ACF having adhesive ability faces and contacts the lead electrodes LE disposed on a face of the base film 510 and another face of the anisotropic conductive film ACF faces and contacts the pad electrodes PAD disposed on the first substrate 101.

In the step S500 of performing the thermocompression bonding of the printed circuit board to the first substrate so that the lead electrodes of the printed circuit board face the pad electrodes, respectively, the base film 510 may be positioned to overlap the first substrate 101. The lead electrodes LE on the base film 510 and the pad electrodes PAD on the first substrate 101 may be disposed to face each other, respectively.

After the alignment between the first substrate 101 and the base film 510 may be completed, the base film 510 may be thermally compressed and bonded to the first substrate 101 using a pressing member. The pressing member may press, for example, the base film 510 at about 3 Mpa to about 6 Mpa. The pressing member may be heated to a predefined temperature, such that the first conductive balls CB1, the second conductive balls CB2, and the bonding resin layer BSR disposed in an area where the lead electrode LE and the pad electrodes PAD overlap each other in the thickness direction may be thermally cured. The predefined temperature may be in a range of, for example, about 140° C. to about 200° C. The pressing member may press the base film 510 only for a predefined time duration. The predefined time duration may be sufficient for thermal curing of the bonding resin layer BSR contained in the anisotropic conductive film ACF. The predefined timed duration may be in a range of, for example, about 4 seconds to 6 seconds.

In the process of performing the thermocompression bonding of the base film 510 to the first substrate 101 using the pressing member, heat and pressure may be applied simultaneously to the first conductive balls CB1 and the second conductive balls CB2 via the lead electrodes LE disposed on a face of the base film 510.

As a result, a surface of the first conductive ball CB1 in contact with a surface of each of the lead electrode LE and the pad electrode PAD may be melted. Thus, a contact area thereof with the surface of the lead electrode LE may be increased under the pressurization, and the molten first conductive ball CB1 may flow under gravity such that the width thereof in a horizontal direction may increase as the first conductive ball CB1 extends from the vertical middle level thereof toward the pad electrode PAD.

Therefore, as a result, the width in the horizontal direction of the first conductive ball CB1 increases as the first conductive ball CB1 extends from the vertical middle level of the first conductive ball CB1 toward each of the lead electrode LE and the pad electrode PAD.

Further, the second conductive balls CB2 have a structure in which the metal layer may be coated on the polymer particle surface. Thus, in case that the heat and pressure are simultaneously applied to the second conductive ball CB2 via the lead electrode LE such that the second conductive ball CB2 may be compressed so as to have an oval shape elongate in the left and right direction in the cross-sectional view.

As the heat may be applied to the bonding resin layer BSR contained in the anisotropic conductive film ACF, thermal curing thereof proceeds. Thus, the bonding resin layer BSR may restrict the movement of the first conductive balls CB1 and the second conductive balls CB2 included in the area in which the anisotropic conductive film ACF may not overlap the lead electrodes LE and/or the pad electrodes PAD in the thickness direction. Therefore, the first conductive balls CB1 and the second conductive balls CB2 located in the area in which the anisotropic conductive film ACF may not overlap the lead electrodes LE and/or the pad electrodes PAD in the thickness direction may be arranged substantially in the same line with the first conductive balls CB1 and the second conductive balls CB2 included in the area in which the anisotropic conductive film ACF overlaps the lead electrodes LE and/or the pad electrodes PAD in the thickness direction, such that the first conductive balls CB1 and the second conductive balls CB2 in the both areas may constitute a row.

Further, the first conductive balls CB1 and the second conductive balls CB2 in the area in which the anisotropic conductive film ACF may not overlap, in the thickness direction, with the lead electrodes LE and/or the pad electrodes PAD may not be subjected to the pressure in the vertical direction via the lead electrode LE and/or the pad electrode PAD and thus may be maintained at original shapes thereof.

Figure 29:
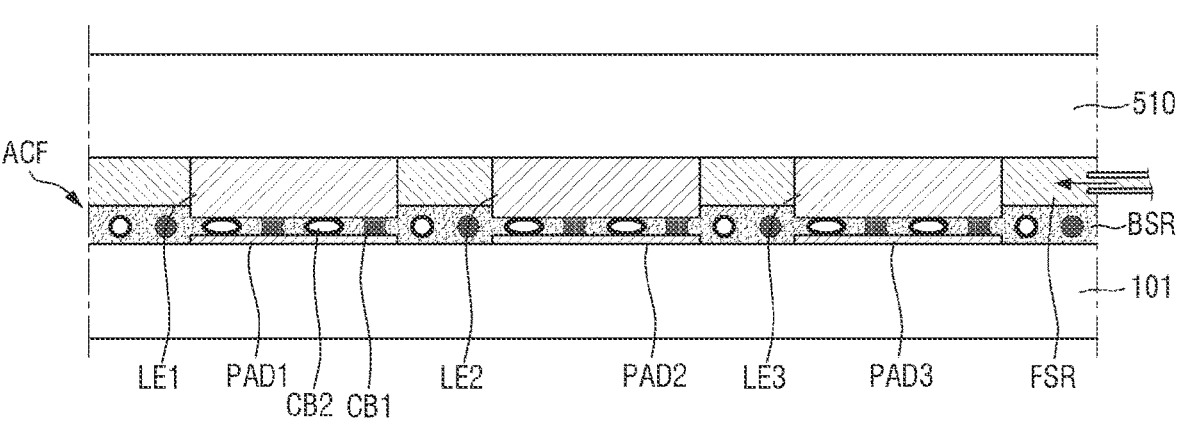
Figure 29:
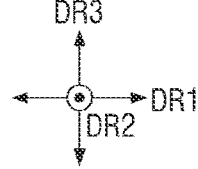

Referring to FIG. 29, in the step S600 of injecting the filling member after the thermocompression bonding of the base film 510 has been completed, the filling member FSR may fill a space defined by the anisotropic conductive film ACF, the base film 510, and the lead electrodes LE.

The filling member FSR may be embodied as an underfill resin. As described above, the filling member FSR may be made of the same type of a resin as that of the bonding resin layer BSR or may be made of a different type of a resin as that thereof. The filling member FSR may be made of a thermally-curable resin or an ultraviolet-curable resin. After curing of the filling member FSR, bonding between the display panel 100 and the printed circuit board 500 may be completed.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device, wherein the display device comprises:
a display panel including a first pad electrode and a second pad electrode;
a printed circuit board including a first lead electrode and a second lead electrode facing the first pad electrode and the second pad electrode, respectively; and
an anisotropic conductive film disposed between the display panel and the printed circuit board, wherein the anisotropic conductive film includes:
a base resin;
a plurality of first conductive balls dispersed in the base resin, each of the plurality of first conductive balls including a core made of a polymer material and at least one metal layer surrounding the core; and
a plurality of second conductive balls dispersed in the base resin, each of the plurality of second conductive balls including a core made of a solder material,
the anisotropic conductive film comprises:
a first area in which the anisotropic conductive film overlaps the first pad electrode and the first lead electrode in a thickness direction of the display device; and
a second area as an area disposed between the first lead electrode and the second lead electrode, and
each of the metal layer of the first conductive ball and a surface of the second conductive ball are in contact with both the first pad electrode and the first lead electrode.

2. The display device of claim 1, wherein the first area includes at least one of the plurality of first conductive balls and at least one of the plurality of second conductive balls.

3. The display device of claim 1, wherein
the first conductive balls and the second conductive balls are alternately arranged with each other, and
the first conductive balls and the second conductive balls are spaced from each other by a constant spacing.

4. The display device of claim 1, wherein each of the first conductive balls and the second conductive balls included in the second area does not overlap the first pad electrode and the first lead electrode.

5. The display device of claim 1, wherein a cross-sectional shape of at least one of the plurality of first conductive balls included in the first area, a cross-sectional shape of at least one of the plurality of second conductive balls included in the first area, a cross-sectional shape of at least one of the plurality of first conductive balls included in the second area, and a cross-sectional shape of at least one of plurality of the second conductive balls included in the second area are different from each other.

6. The display device of claim 5, wherein
in a cross-sectional view of the display device, the cross-sectional shape of the at least one of the plurality of first conductive balls included in the first area is an elliptical shape in which a diameter thereof in a first direction is smaller than a diameter thereof in a second direction intersecting the first direction, and
in the cross-sectional view of the display device, a width in the first direction of the at least one of the plurality of second conductive balls included in the first area increases as the at least one of the plurality of second conductive balls included in the first area extends from a middle vertical level thereof toward each of the lead electrode and the pad electrode.

7. The display device of claim 6, wherein
the cross-sectional shape of the at least one of the plurality of first conductive balls included in the second area is round, the at least one of the plurality of first conductive balls included in the second area includes the core made of the polymer material and the at least one metal layer surrounding the core, the cross-sectional shape of the at least one of the plurality of second conductive balls included in the second area is round, and the at least one of the plurality of second conductive balls included in the second area is made of the solder material.

8. The display device of claim 2, wherein a number of the first conductive balls included in the first area and a number of the second conductive balls included in the first area are equal to each other, and a number of the first conductive balls included in the second area and a number of the second conductive balls included in the second area are different from each other.

9. The display device of claim 2, wherein a number of the first conductive balls included in the first area and a number of the second conductive balls included in the first area are different from each other, and a number of the first conductive balls included in the second area and a number of the second conductive balls included in the second area are equal to each other.

10. The display device of claim 1, wherein a thickness of a portion of the anisotropic conductive film located in the first area is different from a thickness of a portion of the anisotropic conductive film located in the second area.

11. The display device of claim 1, wherein the base resin includes a thermally-curable or photo-curable acrylic resin.

12. The display device of claim 1, wherein the display device further comprises:

a filling member filling the second area and being in contact with the anisotropic conductive film.

13. A display device, wherein the display device comprises:

a display panel including a first pad electrode and a second pad electrode, each having a long side extending in a first direction and a short side extending in a second direction intersecting the first direction;

a printed circuit board including a first lead electrode and a second lead electrode facing the first pad electrode and the second pad electrode, respectively, each of the first lead electrode and the second lead electrode having a long side extending in the first direction and a short side extending in the second direction; and an anisotropic conductive film disposed between the display panel and the printed circuit board, wherein the anisotropic conductive film includes a plurality of first conductive balls and a plurality of second conductive balls, each of the plurality of first conductive balls includes a core made of a polymer material and at least one metal layer surrounding the core, and each of the plurality of second conductive balls includes a core made of a solder material;

the anisotropic conductive film includes:

a first group including a plurality of the first conductive balls arranged in a line in a third direction intersecting the first direction and the second direction and spaced apart from each other by an equal spacing, and a second group including a plurality of the second conductive balls arranged in a line in the third direction and spaced apart from each other by an equal spacing, the first group and the second group extending in a parallel manner to each other, and each of at least one of the plurality of first conductive balls and at least one of the plurality of second conductive balls is in contact with both the first pad electrode and the first lead electrode.

14. The display device of claim 13, wherein spacing between adjacent ones of the plurality of first conductive balls, spacing between adjacent ones of the plurality of second conductive balls, and spacing between two adjacent first and second conductive balls are equal to each other.

15. The display device of claim 14, wherein a first angle is defined between an arrangement axis passing through centers of the plurality of first conductive balls included in the first group and the long side of the first pad electrode or the second pad electrode, the first angle is in a range of 0 degree excusive to 90 degrees inclusive in a plan view, a second angle is defined between an arrangement axis passing through centers of the plurality of second conductive balls included in the second group and the long side of the first pad electrode or the second pad electrode, the second angle is in a range of 0 degree excusive to 90 degrees inclusive in the plan view, and each of the first and second angles satisfies a following Equation 1:

$$\theta \geq \sin^{-1}\left(\frac{P \cos\theta}{L}\right)$$

$$(W > \text{each of } d1 \text{ and } d2),$$

where $\theta$ refers to each of the first and second angles,

W denotes a size of the short side of each of the first and second pad electrodes in the second direction, L denotes a size of the long side of each of the first and second pad electrodes extending in the first direction, P denotes a sum of the size of the short side of each of the first and second pad electrodes extending in the second direction and a spacing in the second direction between the adjacent first and second pad electrodes, d1 denotes a spacing between the first conductive balls arranged in a line and closest to each other in the plan view, and d2 denotes a spacing between the second conductive balls arranged in a line and closest to each other in the plan view.

16. The display device of claim 13, wherein the anisotropic conductive film further includes a third group including a plurality of the first conductive balls arranged in a line in the third direction and spaced apart from each other by an equal spacing, and the third group is disposed between the first group and the second group in case that the first, second and third groups extend in a parallel manner to each other.

17. The display device of claim 13, wherein the anisotropic conductive film further includes a fourth group including a plurality of the second conductive balls arranged in a line in the third direction and spaced apart from each other by an equal spacing, and the fourth group is disposed between the first group and the second group in case that the first groups, second groups, and fourth groups extend in a parallel manner to each other.

18. An anisotropic conductive film, wherein the anisotropic conductive film comprises:

a base resin including a thermally-curable or photo-curable acrylic resin;

a plurality of first conductive balls dispersed in the base resin, each of the plurality of first conductive balls including a core made of a polymer material and at least one metal layer surrounding the core; and a plurality of second conductive balls dispersed in the base resin, each of the plurality of second conductive balls includes a core made of a solder material.

19. An anisotropic conductive film, wherein anisotropic conductive film comprises:

a plurality of first conductive balls, each of the plurality of first conductive balls including a core made of a polymer material and at least one metal layer surrounding the core;

a plurality of second conductive balls, each of the plurality of second conductive balls includes a core made of a solder material, a plurality of first groups, each including a plurality of the first conductive balls arranged in a line in a third direction and spaced apart from each other by an equal spacing, the third direction intersecting a first direction as a vertical direction and a second direction as a horizontal direction perpendicular to the vertical direction; and a plurality of second groups, each including a plurality of the second conductive balls arranged in a line in the third direction and spaced apart from each other by an equal spacing, wherein the first groups and the second groups are alternately arranged with each other and extend in a parallel manner to each other.

20. The anisotropic conductive film of claim 19, wherein the spacing between adjacent ones of the plurality of first conductive balls, the spacing between adjacent ones of the plurality of second conductive balls, and spacing between two adjacent first and second conductive balls are equal to each other.

\* \* \* \* \*